US009318214B2

(12) United States Patent
Hosono et al.

(10) Patent No.: US 9,318,214 B2
(45) Date of Patent: Apr. 19, 2016

(54) NONVOLATILE SEMICONDUCTOR MEMORY DEVICE WITH A THREE-DIMENSIONAL STRUCTURE IN WHICH SUB-BLOCKS ARE INDEPENDENTLY ERASABLE

(71) Applicant: KABUSHIKI KAISHA TOSHIBA, Tokyo (JP)

(72) Inventors: Koji Hosono, Kanagawa (JP); Naoya Tokiwa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 223 days.

(21) Appl. No.: 14/015,987

(22) Filed: Aug. 30, 2013

(65) Prior Publication Data

US 2014/0247664 A1    Sep. 4, 2014

(30) Foreign Application Priority Data

Mar. 1, 2013    (JP) ................................. 2013-040525

(51) Int. Cl.
*G11C 16/34* (2006.01)
*G11C 16/04* (2006.01)
*G11C 11/56* (2006.01)

(52) U.S. Cl.
CPC ........ *G11C 16/3404* (2013.01); *G11C 16/0483* (2013.01); *G11C 16/3427* (2013.01); *G11C 11/5628* (2013.01)

(58) Field of Classification Search
CPC ........... G11C 16/3404; G11C 16/0483; G11C 16/3427; G11C 11/5628
See application file for complete search history.

(56) References Cited

U.S. PATENT DOCUMENTS

| 6,657,891 | B1 * | 12/2003 | Shibata .............. G11C 11/5628 365/185.03 |
| 6,819,592 | B2 | 11/2004 | Noguchi et al. |
| 6,819,952 | B2 | 11/2004 | Pfefferbaum et al. |
| 6,967,874 | B2 | 11/2005 | Hosono |
| 7,006,379 | B2 | 2/2006 | Noguchi et al. |
| 2006/0050594 | A1 * | 3/2006 | Park ....................... G11C 16/16 365/230.05 |
| 2008/0019188 | A1 * | 1/2008 | Li ........................... G11C 8/10 365/185.22 |

FOREIGN PATENT DOCUMENTS

JP        3829088 B2    10/2006

OTHER PUBLICATIONS

Y. Komori, et al., "Disturbless Flash Memory due to High Boot Efficiency on BiCS Structure and Optimal Memory Film Stack for Ultra High Density Storage Device", IEDM Technical Digest, pp. 851-854, 2008.

Taiwanese Office Action mailed Sep. 14, 2015 in counterpart Taiwanese Patent Application 102127149 with English Translation.

\* cited by examiner

*Primary Examiner* — J. H. Hur
(74) *Attorney, Agent, or Firm* — Patterson & Sheridan, LLP

(57) ABSTRACT

A memory cell array includes a plurality of memory strings divided into a plurality of sub-blocks, each memory string including a plurality of memory cells which are connected to word lines and each sub-block being erasable independently with respect to the other sub-blocks. During writing, a control unit changes a verification level to be applied to a selected word line included in a selected sub-block depending on whether or not data has been written in a non-selected sub-block.

11 Claims, 24 Drawing Sheets

NONVOLATILE SEMICONDUCTOR MEMORY DEVICE WITH A THREE-DIMENSIONAL STRUCTURE IN WHICH SUB-BLOCKS ARE INDEPENDENTLY ERASABLE

CROSS-REFERENCE TO RELATED APPLICATION

This application is based upon and claims the benefit of priority from Japanese Patent Application No. 2013-040525, filed Mar. 1, 2013, the entire contents of which are incorporated herein by reference.

FIELD

Embodiments described herein relate generally to a nonvolatile semiconductor memory device with a three-dimensional structure.

BACKGROUND

With refinement of elements and an increase in memory capacity, a NAND type flash memory with a three-dimensional structure has been developed. According to such NAND type flash memory, a threshold voltage of a previously written memory cell may vary if data is written subsequently in a different memory cell.

DETAILED DESCRIPTION

Figure 1:
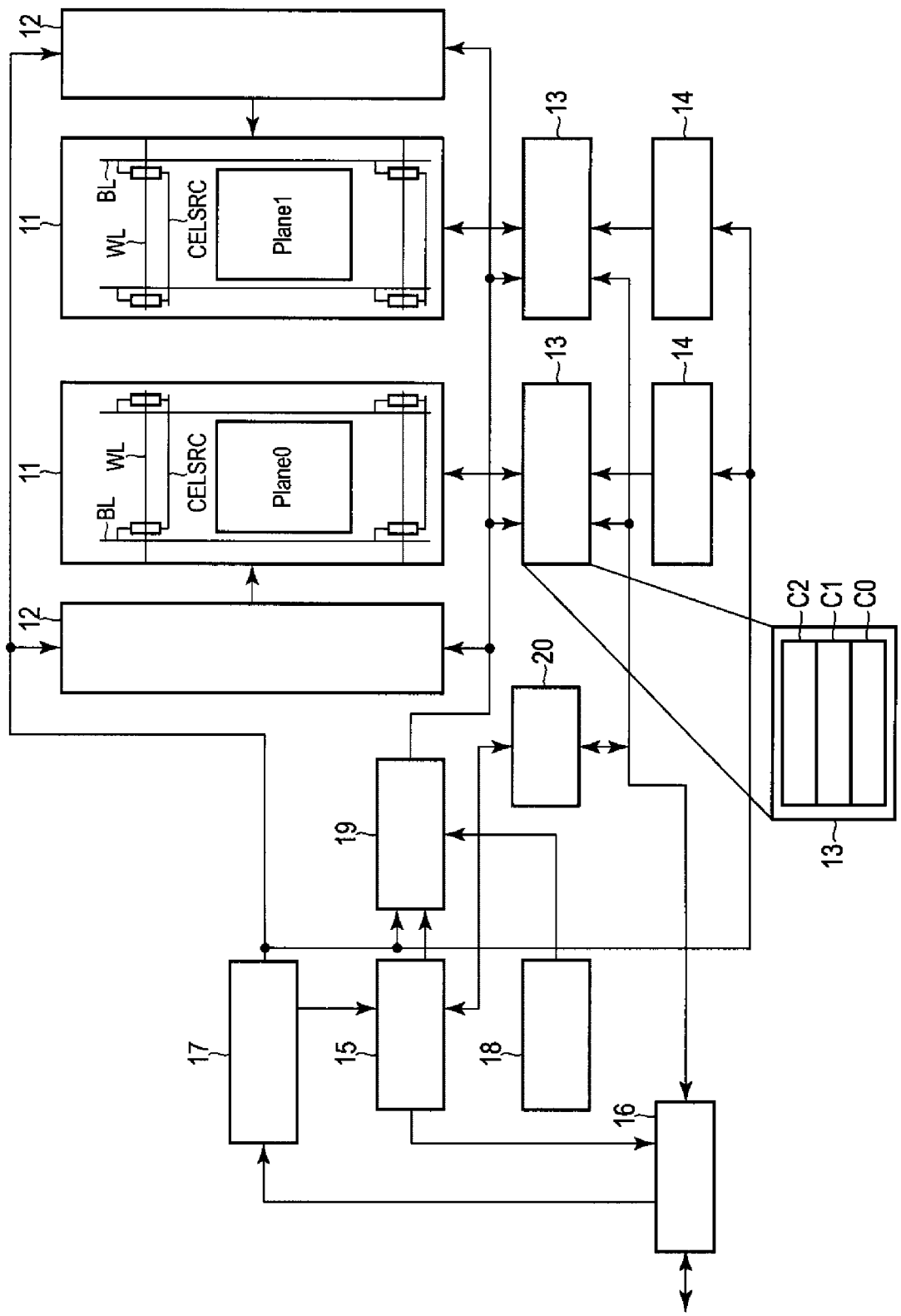
FIG. 1 is a configuration diagram schematically showing a nonvolatile semiconductor memory device according to embodiments.

According to exemplary embodiments, there is provided a nonvolatile semiconductor memory device capable of preventing a width of threshold voltage distribution from expanding in memory cells of adjacent sub-blocks if erasing from a selected sub-block is performed.

In general, according to one embodiment, a nonvolatile semiconductor memory device includes: a memory cell array which includes a plurality of memory strings including a plurality of memory cells connected to word lines and is capable of erasing data in units of sub-blocks, the plurality of memory strings being divided into a plurality of sub-blocks; a control unit which changes a verification level to be applied to a selected word line included in a selected sub-block when data is written, depending on whether or not data is written in a non-selected sub-block; and flag cells which are respectively provided in the plurality of sub-blocks and store flag data indicating whether or not the data has been written in the sub-blocks, wherein when the flag data which is stored in the flag cell in the non-selected sub-block indicates writing, the control unit sets a verification level to be supplied to a word line which is connected to the selected memory cell to be higher than a verification level to be supplied to the word line which is connected to the selected memory cell when no data is written in the non-selected sub-block.

In a NAND type flash memory with a three-dimensional structure, the number of word lines included in a predetermined region or the number of bit lines increases if a memory array is extended in a laminate direction. With a two-dimensional structure, for example, it is difficult to connect all the word lines to a word line selecting transistor due to restriction in wiring pitch. As a result, the number of word line selecting transistors increases, and the area of a row decoder increases. Thus, a method of suppressing the increase in the number of wirings to be connected to the word line selecting transistor by commonly using the word lines by a plurality of NAND strings which are controlled by different selection gates has been used. As a result, the problems such as the increases in the number of wirings and the area can be solved while there is a problem that a block size for erasing increases due to the common use of the word lines. Thus, a method in which a sub-block including one or more word lines is defined within a NAND type memory string for enabling erasing and writing in units of sub-blocks, has been examined as a method for reducing the block size for erasing.

It is known that if data is written in a memory cell which is connected to a word line in the NAND type flash memory, and thereafter, data is written in a memory connected to a word line which is included in the same memory string, a threshold voltage of the memory cell in which the data is previously written varies.

In addition, after data is written in a certain memory cell, if erasing from the other memory cells which are included in the same memory string as that of the memory cell is performed, the threshold voltage varies in an opposite direction. Therefore, it is necessary to prevent variations in threshold voltage distribution, for example, to prevent a width of the threshold voltage distribution from expanding when a sub-block is set in a NAND type string and erasing or writing is performed.

Hereinafter, a description will be given of embodiments with reference to drawings. In all the drawings, same reference numerals are given to same components.

First Embodiment

Configuration

First, a description will be given of an entire configuration of a nonvolatile semiconductor memory device according to a first embodiment with reference to FIG. 1.

As shown in FIG. 1, the nonvolatile semiconductor memory device according to the first embodiment includes memory cell arrays 11, row decoders 12, data circuits and page buffers 13, column decoders 14, a control circuit 15, input and output circuit 16, an address command register 17, an internal voltage generating circuit 18, a core driver 19, and a flag register 20.

Figure 2:
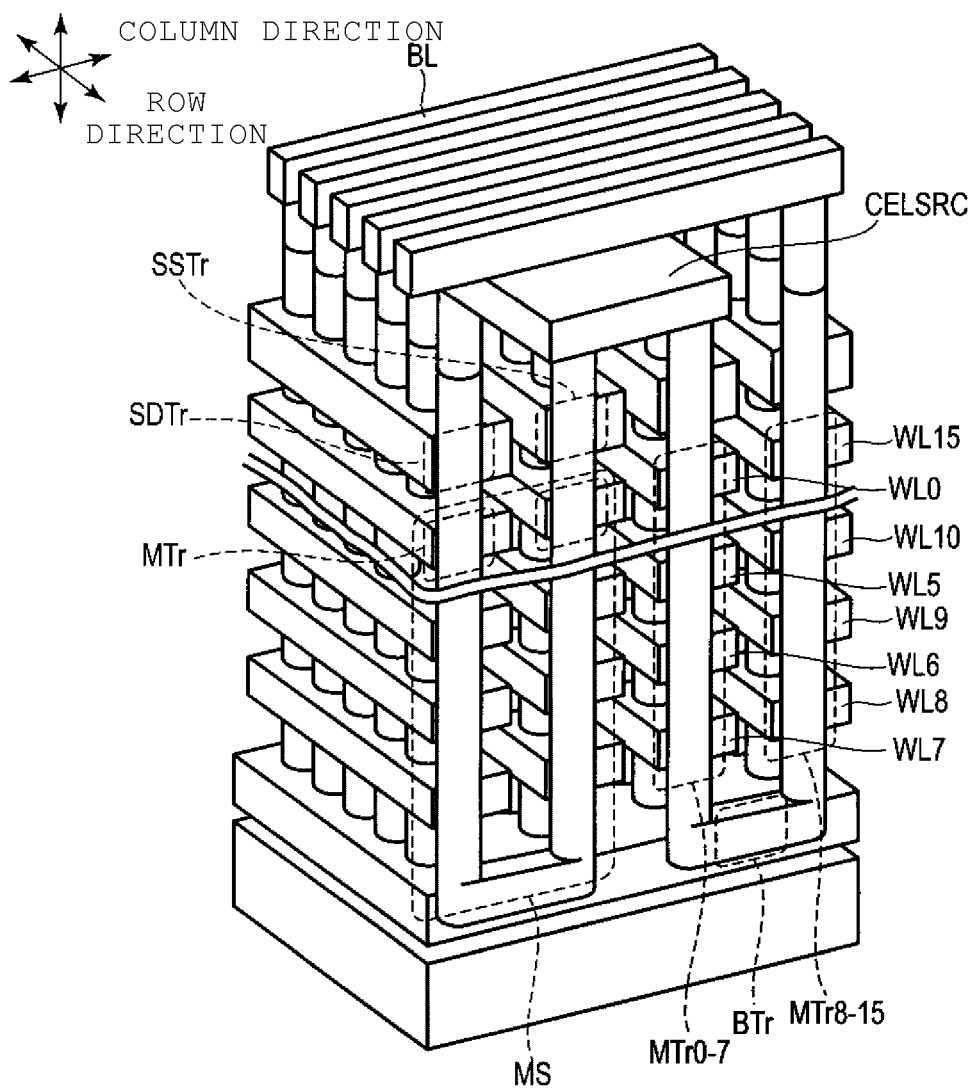
FIG. 2 is a perspective view showing an example of a memory cell array shown in FIG. 1.

Each of the memory cell arrays 11 includes a plurality of bit lines BL which extend in a column direction, a plurality of source lines CELSRC which extend in a row direction intersecting the bit lines BL, and a memory string MS to which a plurality of electrically rewritable memory cells MTr are connected in series as shown in FIG. 2. Although the description of this embodiment will be given on the assumption that two memory cell arrays 11 are in a memory chip, the technique described in this embodiment is not limited to a case where the number of memory cell arrays is two and can be applied to an apparatus in which only one memory cell array 11 is present in a memory chip or an apparatus in which three or more memory cell arrays 11 are present in a single memory chip.

As shown in FIG. 2, each memory cell array 11 is configured such that memory cells MTr which electrically store data are aligned in a three-dimensional matrix shape. That is, the memory cells MTr are aligned in the matrix shape in a laminate direction and aligned in the matrix shape even in a horizontal direction which perpendicularly intersects the laminate direction. The plurality of memory cells MTr which are arranged in the laminate direction are connected in series so as to make up the memory string MS.

A drain side selected transistor SDTr and a source side selected transistor SSTr which are brought into a conductive state when selected are connected to both ends of the memory string MS. The memory string MS is aligned such that the laminate direction corresponds to a longitudinal direction. One end of the drain side selected transistor SDTr is connected to a bit line BL. One end of the source side selected transistor SSTr is connected to a source line CELSRC.

Referring again to FIG. 1, the row decoders 12 decode a block address signal or the like which is input from the address command register 17 and control the memory cell arrays 11 in response to a word line control signal or a selected gate control signal which is input from the core driver 19.

The data circuits and page buffers 13 read data from the memory cell arrays 11 and temporarily store the data in page buffers during a reading operation. In addition, written data is loaded from the outside of the chip to the data circuits and page buffers 13 and written in a selected memory cell during a writing operation.

In this embodiment, each of the data circuits and page buffers 13 includes three cache memories C0 to C2 in order to handle a two bit/cell storage scheme for storing two-bit data in a single memory cell. The cache memories C1 and C2 respectively store one of lower order page data (LOWER) and upper order page data (UPPER) of the two-bit data. In addition, the cache memory C0 is prepared in order to store temporary data for controlling writing for each bit based on a result of a verifying reading operation during the writing operation, for example.

The column decoders 14 decode a column address signal which is input from the address command register 17 and control an input and output of data. The control circuit 15 controls the internal voltage generating circuit 18 which generates various levels of voltage required for a core operation and controls the core driver 19 which controls the word line and the bit line based on a predetermined sequence in response to a signal for executing a reading, writing, or erasing operation which is sent from the address command register 17.

Furthermore, the control circuit 15 specifies a flag which will be described later and controls voltage of the word line. A flag is set for each page, and a flag read from a page is stored in a flag register 20 via the cache memories C0 to C2. The control circuit 15 controls a verification level in accordance with the flag stored in the flag register 20. Writing of the flag will be described later.

The input and output circuit 16 controls an input and an output of command address data.

Figure 3:
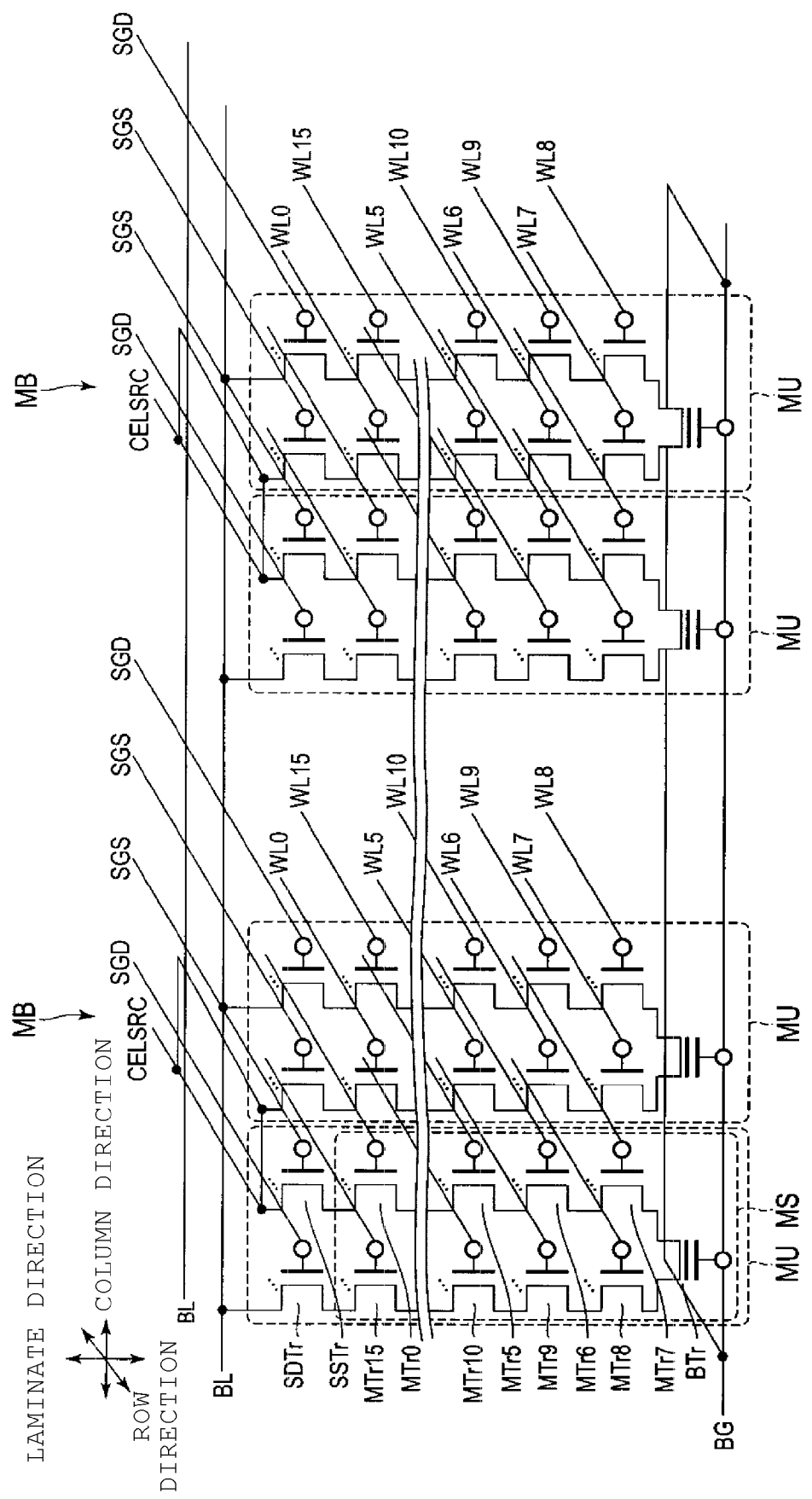
FIG. 3 is a circuit diagram showing an example of the memory cell array shown in FIG. 1.

Next, a description will be given of a circuit configuration of each memory cell array 11 with reference to FIG. 3. FIG. 3 is an equivalent circuit diagram of memory cells MTr, the drain side selected transistor SDTr, the source side selected transistor SSTr which are formed along a cross section of the memory cell array 11 in the column direction, and peripheral circuits thereof.

The memory cell array 11 includes the plurality of bit lines BL and the plurality of memory blocks MB as shown in FIG. 3. The bit lines BL extend in a stripe shape so as to cross over the plurality of memory blocks MB in the column direction at a predetermined pitch in the row direction. The memory blocks MB are repeatedly arranged in the column direction at a predetermined pitch.

Each memory block MB includes a plurality of memory units MU which are aligned in the matrix shape in the row direction and the column direction perpendicularly intersecting the row direction as shown in FIG. 3. In the memory block MB, a plurality of memory units MU which are commonly connected are provided for one bit line BL.

Each of the memory units MU includes the memory string MS, the source side selected transistor SSTr, and the drain side selected transistor. SDTr. The memory units MU are aligned in the matrix shape in the row direction and the column direction.

In addition, a plurality of memory cells which are connected to word lines WL0 to WL7 configure one sub-block as will be described later, and a plurality of memory cells which are connected to word lines WL8 to WL15 configure one sub-block in the plurality of memory units MU (memory strings MS) which are arranged in the row direction. These sub-blocks configure an erasing unit, and data is erased for each sub-block as will be described later in the first embodiment.

Although the above description has been given of a sub-block which has been configured by ½ memory strings, this embodiment is not limited thereto, and the sub-block may be configured by memory strings which are divided into ¼ or ⅛.

The memory string MS includes a plurality of memory cells MTr0 to MTr15 which are connected in series and a back gate transistor BTr. The memory cells MTr0 to MTr7 are connected in series in the laminate direction. The memory cells MTr8 to MTr15 are similarly connected in series in the laminate direction. The memory cells MTr0 to MTr15 store information by accumulating electric charge in electric charge accumulating layers.

The back gate transistor BTr is connected between the memory cell MTr7 in the lowermost layer and the memory cell MTr8. Accordingly, the memory cells MTr0 to MTr15 and the back gate transistor BTr are connected in a U shape in a cross section in the column direction. The drain of the source side selected transistor SSTr is connected to the other end of the memory string MS (the source of the memory cell MTr0). The source of the drain side selected transistor SDTr is connected to one end (the drain of the memory cell MTr15) of the memory string MS.

In the memory units MU, the gates of the memory cells MTr0 in one memory block MB are commonly connected to the word line WL0. Similarly, the gates of the memory cells MTr1 to MTr15 in one memory block MB are commonly connected to the corresponding word lines WL1 to WL15, respectively. In addition, the gates of the back gate transistors BTr which are aligned in the matrix shape in the row direction and the column direction are commonly connected to a back gate line BG.

In the memory units MU, the gates of the drain side selected transistors SDTr which are aligned in a line in the row direction are commonly connected to a drain side selected gate line SGD which extends in the row direction. In addition, the drains of the drain side selected transistors SDTr which are aligned in a line in the column direction are commonly connected to the bit line BL.

In the memory units MU, the gates of the source side selected transistors SSTr which are aligned in a line in the row direction are commonly connected to a source side selected gate line SGS which extends in the row direction. In addition, in a pair of memory units MU which are adjacent in the column direction, the sources of the source side selected transistors SSTr which are aligned in a line in the row direction are commonly connected to the source line CELSRC which extends in the row direction.

Figure 4:
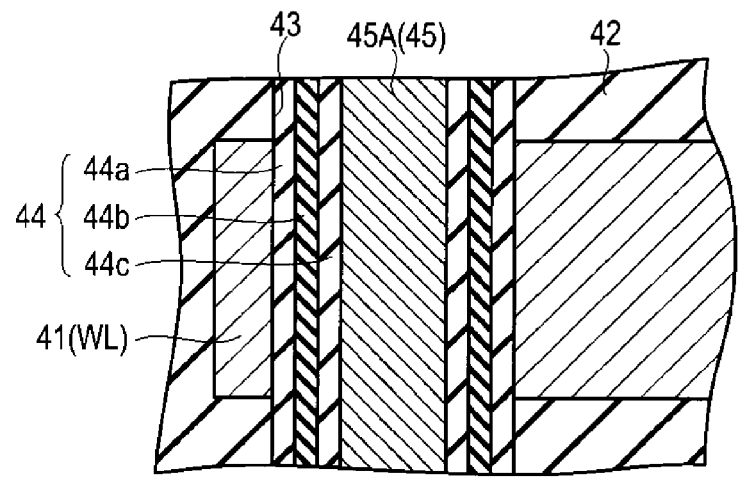
FIG. 4 is a cross-sectional view showing an example of a memory cell shown in FIG. 2.

FIG. 4 is a cross-sectional view of the memory cell shown in FIG. 2.

A word line conductive layer 41 includes a part which is formed in the stripe shape extending in the row direction at a predetermined pitch in the column direction. The word line conductive layer 41 is formed of polysilicon (poly-Si) or polycide. The word line conductive layer 41 corresponds to a control gate of the memory cell device.

A memory hole 43 which is formed so as to penetrate through the word line conductive layer 41 and an insulating layer 42 includes a memory gate insulating layer 44 and a columnar semiconductor layer 45 therein.

The memory gate insulating layer 44 includes a block insulating layer 44a, an electric charge accumulating layer 44b, and a tunnel insulating layer 44c. The block insulating layer 44a is formed of silicon oxide ($SiO_2$). The electric charge accumulating layer 44b is formed on the block insulating layer 44a. The electric charge accumulating layer 44b is used for accumulating electric charge and stores data in the memory cells MTr0 to MTr15. The electric charge accumulating layer 44b is formed of silicon nitride (SiN). The tunnel insulating layer 44c is formed on the electric charge accumulating layer 44b. The tunnel insulating layer 44c is formed of silicon oxide ($SiO_2$). The columnar semiconductor layer 45 is formed of polysilicon (poly-Si). The semiconductor layer 45 above and below the word line conductive layers 41 corresponds to the drain terminal or the source terminal of the memory cell device and is electrically connected to the bit line or the cell source line. Since cell current which flows through the semiconductor layer 45 varies in accordance with the potential of the word line conductive layers and the electric charge accumulating state of the electric charge accumulating layer, data is stored by using this property.

Data Storage Method

Next, a description will be given of a data storage method of the nonvolatile semiconductor memory device with reference to FIG. 5.

Here, a description will be given of a case of a 2 bit/cell which stores two-bit information in one memory cell.

Figure 5:
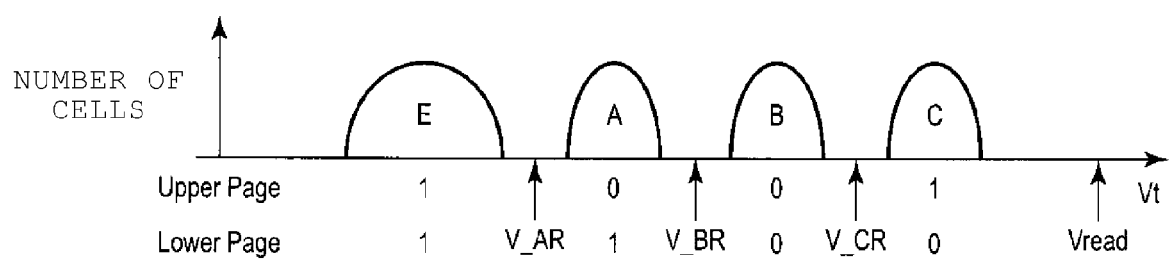
FIG. 5 is a diagram showing a data storing method of the nonvolatile semiconductor memory device according to the embodiments.

FIG. 5 shows distribution of four threshold values which are applied to the 2 bit/cell and data allocation. Since the memory cell according to this embodiment includes the electric charge accumulating layer as described above, it is possible to obtain a desired threshold voltage by controlling an amount of the electric charge stored in the electric charge accumulating layer. The lowest threshold distribution E corresponds to a threshold voltage which is obtained by an erasing operation. Distributions A to C which are above the threshold distribution E are threshold distributions which are obtained by a writing operation.

The 2 bit/cell stores two bits as data corresponding to two page addresses. That is, data on a lower order (lower) page and data on an upper order (upper) page are stored in one memory cell. Data "1" on the lower order page corresponds to the distribution E and the distribution A, and data "0" corresponds to the distribution B and the distribution C. Data "1" on the upper order page corresponds to the distribution E and the distribution C, and data "0" corresponds to the distribution A and the distribution B.

As for the data on the lower order page, it is possible to read the data "1" or "0" by performing the reading operation by using word line voltage V_BR. That is, if a threshold value corresponding to the distribution E or the distribution A is stored in a memory cell and the potential of the word line (control gate) is higher than the threshold value of the memory cell, the memory cell is brought into an ON state, and the cell current flows from the bit line toward the cell source line. On the other hand, if the threshold value corresponding to the distribution B or the distribution C is stored in the memory cell, the potential of the control gate is lower than the threshold value of the memory cell, and therefore, the memory cell is brought into an OFF state, and the cell current does not flow. Such a difference in the cell current is detected by a sensing amplifier in the data circuit which is connected to the bit line, and it is possible to determine whether the data in the memory cell corresponds to "0" or "1".

In the case of the upper order page, the reading operation is performed by using V_AR and V_CR as the word line potential, and data can be specified by performing predetermined computation in the data circuit. That is, the data in the memory cell, the threshold voltage of which is determined to be between V_AR and V_CR, is determined to be "0", and the data is determined to be "1" if the threshold voltage of the memory cell is determined to be lower than V_AR and determined to be higher than V_CR.

Variation in Threshold Voltage of NAND Flash Memory with General Three-Dimensional Structure Referring to FIGS. 6A to 6G, a description will be given of properties of the memory cells when reading, writing, and erasing operations are performed on the plurality of memory cells shown in FIG. 3.

FIGS. 6A to 6G show a threshold value distribution corresponding to four pages in the memory string after the erasing operation is performed. Although all the pages in the memory string are targets in practice, only a description of the word lines WL0 and WL7 which belong to a half of the memory string on the source side and the word lines WL8 and WL15 which belong to the other half on the drain side (on the side of the bit line) will be given for the purpose of simply showing behaviors of the cell properties. In addition, a group including the word lines WL0 to WL7 will be referred to as a sub-block SubB_A, and a group including WL8 to WL15 will be referred to as a sub-block SubB_B. Here, the sub-block includes memory cells of all the memory units which are connected to the word lines WL0 to WL7, for example.

Figure 6A:
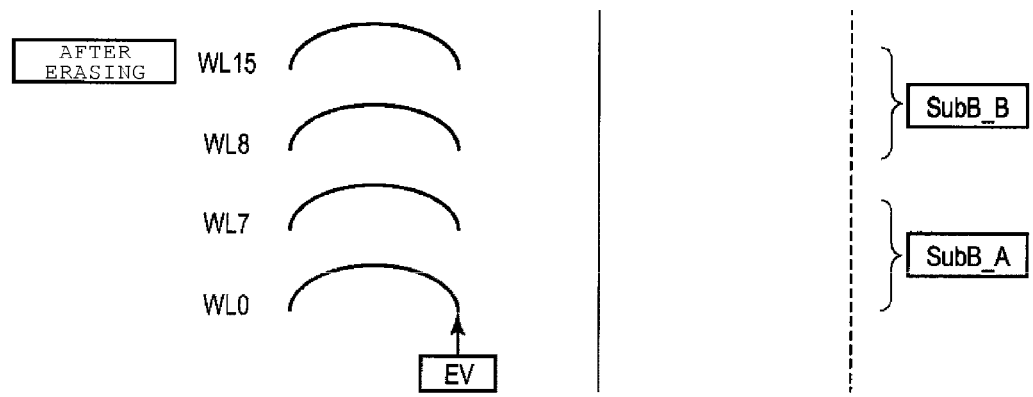
FIG. 6A is a diagram showing variation in threshold voltage distribution during a sub-block writing operation.

As shown in FIG. 6A, the threshold voltage distribution of the respective pages after the erasing becomes a threshold value distribution in which the highest threshold voltage is around erasing verification level EV when the erasing operation is ideally performed.

Figure 6B:
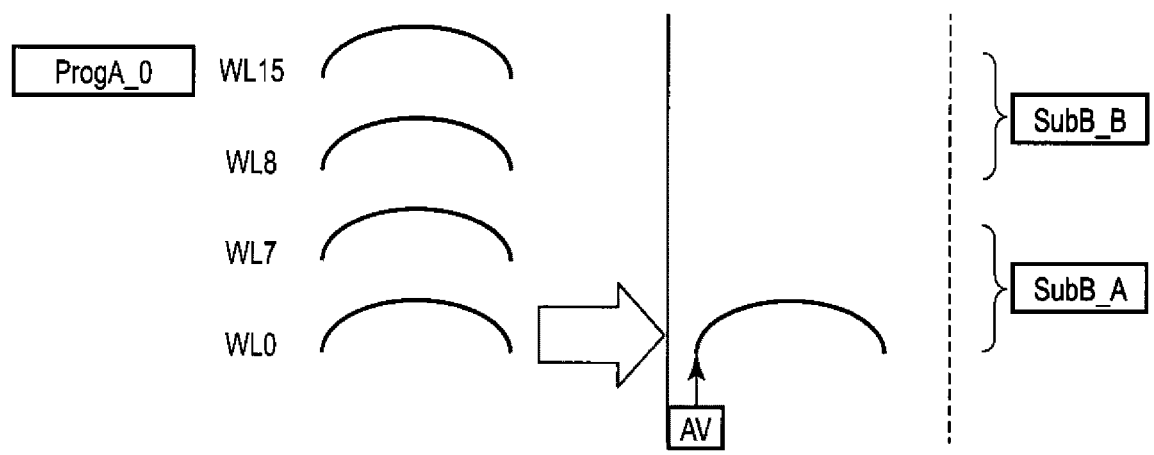
FIG. 6B is a diagram showing variation in the threshold voltage distribution during the sub-block writing operation.

Next, as shown in FIG. 6B, writing data in the cells of the word line WL0 is performed so as to bring the cells into an A state. AV represents a writing verification level in the A state, and a threshold value distribution which is equal to or more than the writing verification level AV is achieved if writing is normally performed.

Thereafter, writing data in the cells of the word lines WL1 to WL7 is sequentially performed.

Figure 6C:
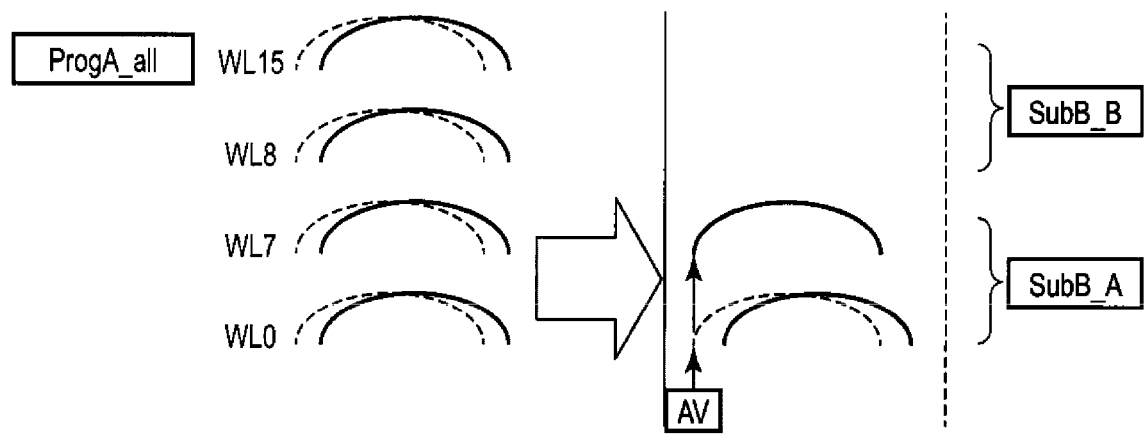
FIG. 6C is a diagram showing variation in the threshold voltage distribution during the sub-block writing operation.

FIG. 6C shows a state where the writing in the word line WL7 is completed. At this time, the threshold value distribution of the word line WL0 shifts to a side of a slightly high threshold value. The shift is an effect which is caused by the cell current decreasing immediately after the writing in the word line WL0 is performed by writing data in the memory cells from the word lines WL1 to WL7 in the same memory string if attention is paid to the memory cells which are connected to the word line WL0. Here, the shift will be referred to as back pattern noise.

Although the magnitude of the back pattern noise varies depending on what kind of written data is stored in the same memory string, it is assumed here that the noise has average magnitude in any cases. The state of the noise corresponds to a state where random processing is intentionally added so as to obtain written data with a pattern which is not significantly biased, for example.

Figure 6D:
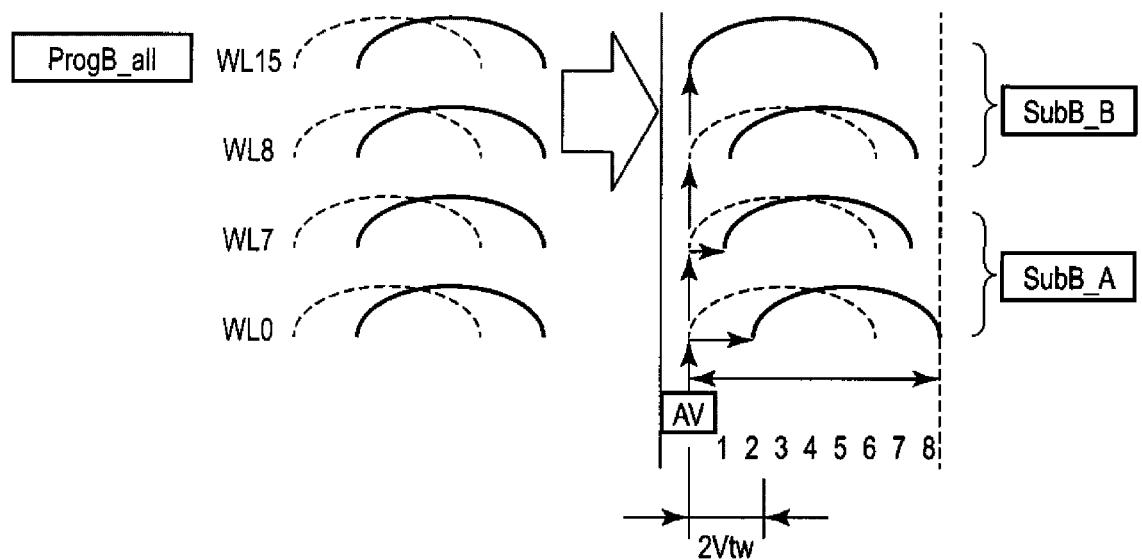
FIG. 6D is a diagram showing variation in the threshold voltage distribution during the sub-block writing operation.

FIG. 6D shows a state where writing in the memory cells which are connected to the word lines WL8 to WL15 is then similarly performed. If such writing is executed, the back pattern noise of the word line WL0 further increases due to the written data of the word lines WL8 to WL15. Since the writing is typically performed in an order from the memory cell on the cell source side to the memory cell on the drain side in the NAND flash memory, the largest back pattern noise is obtained in the memory cell on which writing is performed at the beginning.

Here, a distribution shown by the dotted lines in the distribution of the respective word lines respectively represents distribution immediately after the writing is performed. The state where the random writing as described above is not performed means that the threshold value state immediately after the writing is maintained even after the writing in the other cells is completed.

Figure 6E:
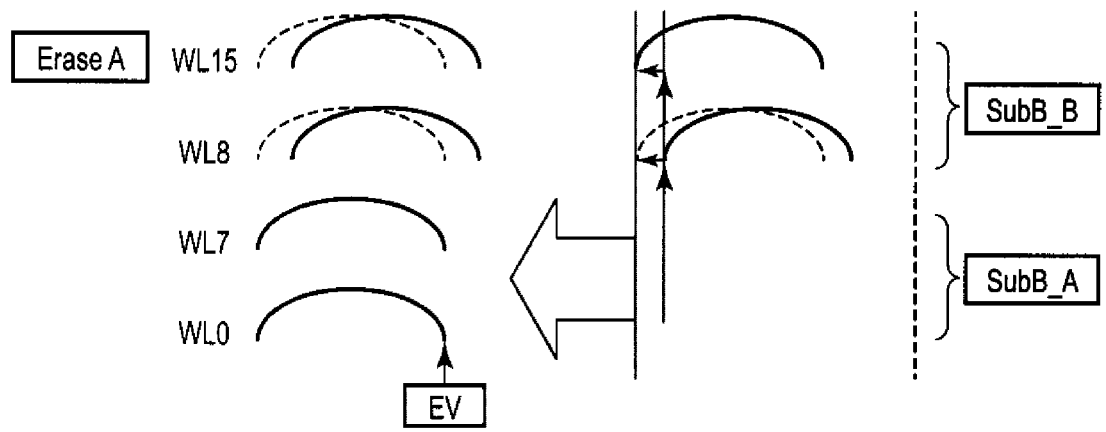
FIG. 6E is a diagram showing variation in the threshold voltage distribution during the sub-block writing operation.

Next, FIG. 6E shows a case where erasing from the memory cells which are connected to the word lines WL0 to WL7 including the sub-block SubB_A is performed from the state in FIG. 6D.

By the erasing operation, the cells which are connected to the word lines WL0 to WL7 are returned into a threshold value state where the erasing verification level EV corresponds to the upper limit, and the threshold value distribution of the cells which are connected to the word lines WL8 to WL15 shifts to a side of lower threshold value distribution by a predetermined amount since there is no back pattern of the word lines WL0 to WL7.

Figure 6F:
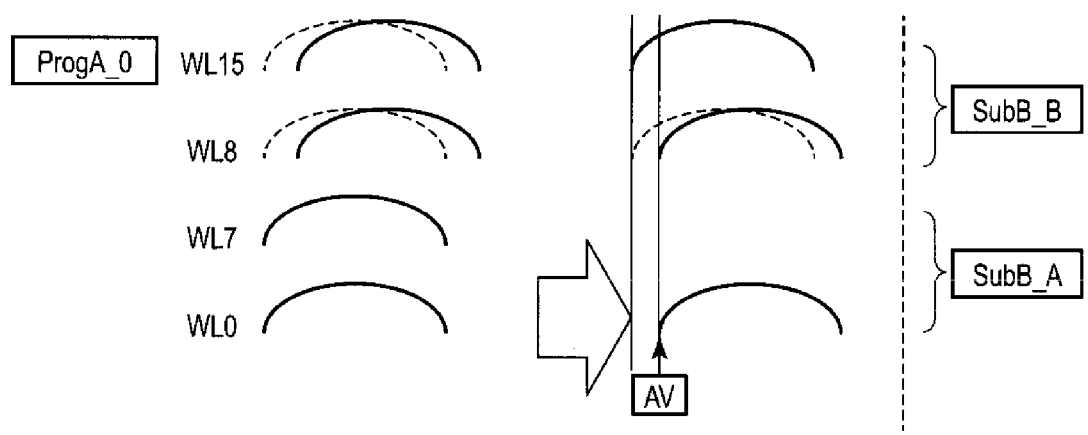
FIG. 6F is a diagram showing variation in the threshold voltage distribution during the sub-block writing operation.

Thereafter, the threshold value distribution of the word lines WL8 to WL15 does not significantly vary if writing in the memory cells which are connected to the word line WL0 is performed again as shown in FIG. 6F. That is, since significantly large back pattern noise is not generated merely by the data pattern of the word line WL0, the threshold value distribution of the word lines WL8 to WL15 does not significantly vary.

Figure 6G:
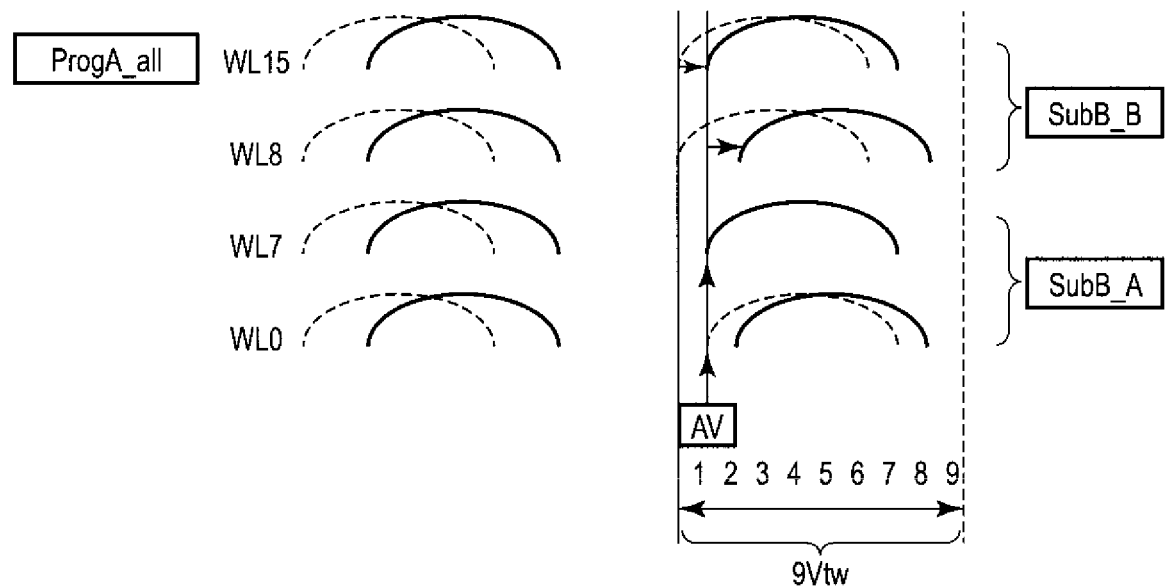
FIG. 6G is a diagram showing variation in the threshold voltage distribution during the sub-block writing operation.

Next, if writing in the residual word lines WL1 to WL7 is performed as shown in FIG. 6G, the word line WL0 is affected by the back pattern noise due to the writing. However, the word line WL7 is changed to have a threshold value distribution in which the verification level AV corresponds to the lower limit since the word line WL7 is in a state immediately after the writing.

The widths of the shift amounts of the threshold value distribution in the A state when writing and erasing are performed are as shown in FIG. 6E of the smallest shift amount and in FIG. 6D of the largest shift amount as described above. Here, if the distribution width of the threshold voltage when writing is performed by verification for each bit is assumed to be 6 Vtw and a change amount of the threshold voltage when writing in a word line in one sub-block is performed is assumed to be 1 Vtw in order to quantify the range of the threshold voltage distribution, the range of the threshold voltage distribution in the A state is 9 Vtw. Therefore, there is a problem that the shift amount of the threshold voltage distribution increases as a whole by the writing operation after erasing is performed from the sub-block and the range of the threshold voltage distribution is widened.

First Embodiment

Figure 7:
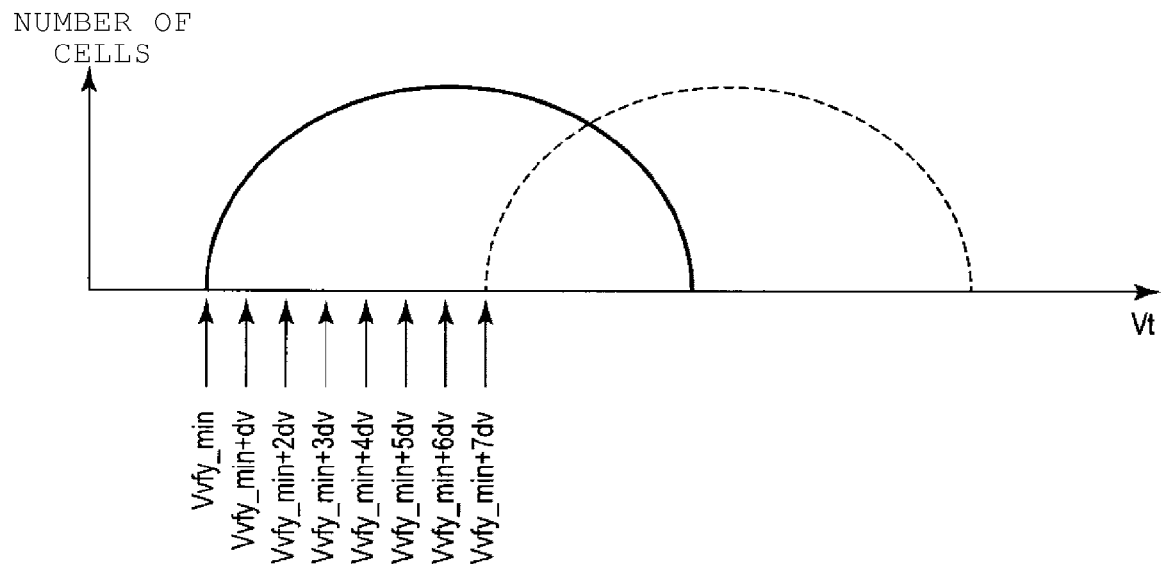
FIG. 7 is a diagram showing an example of a writing verification level according to a first embodiment.

FIG. 7 shows a first embodiment and shows an example of a writing verification level for a predetermined written state.

FIG. 7 shows an example in which level setting in eight stages is possible at constant step voltage dv in a threshold voltage distribution in which Vvfy_min corresponds to the lower limit. The setting levels are applied to any of four-value threshold voltage distribution levels A, B, and C, for example.

Referring to FIGS. 8A to 8J, a description will be given of an operation when the first embodiment is applied to the threshold voltage distribution in the level A in the same manner as in FIGS. 6A to 6G, for example.

Figure 8A:
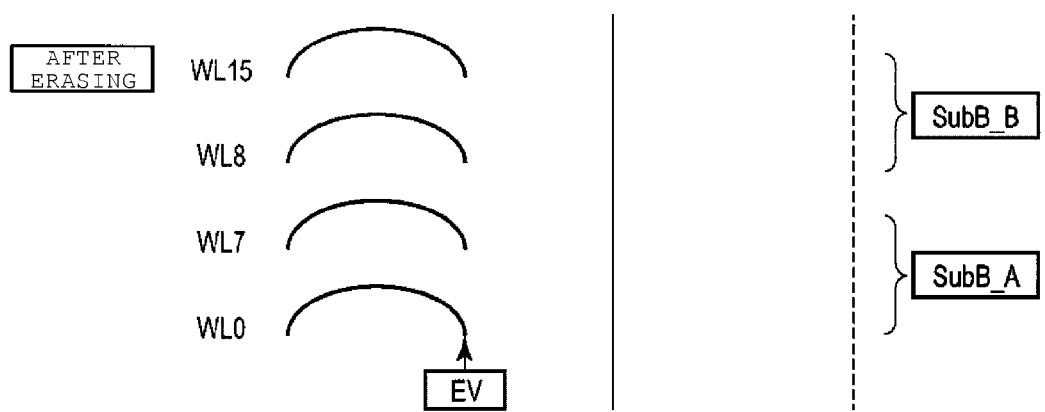
FIG. 8A is a diagram showing variation in threshold voltage distribution during a sub-block writing operation according to the first embodiment.
Figure 8B:
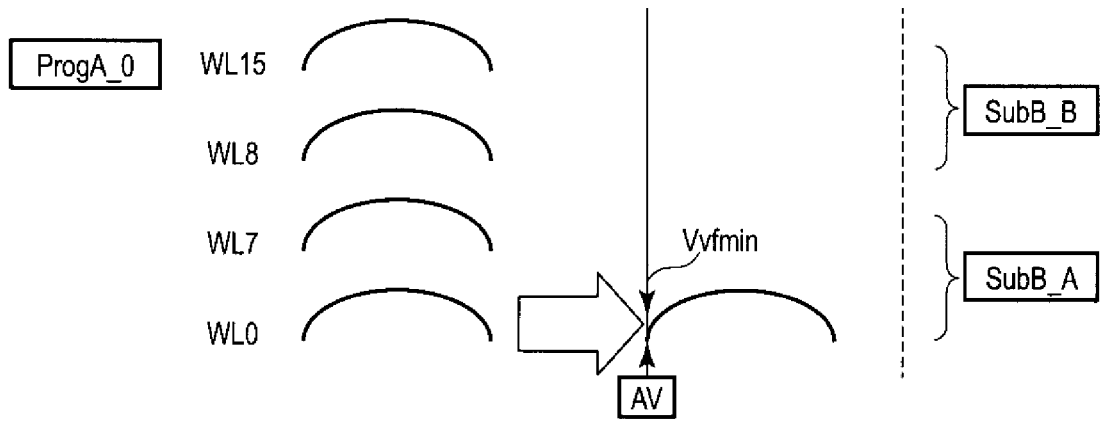
FIG. 8B is a diagram showing variation in the threshold voltage distribution during the sub-block writing operation according to the first embodiment.

FIG. 8A shows a threshold voltage distribution after the erasing, and FIG. 8B shows a case where the connection to the word line WL0 is established and the A state is written in the memory cell. FIGS. 8A and 8B are the same as FIGS. 6A and 6B. The verification level of the word line WL0 is set to Vvfymin, for example.

Thereafter, the verification level is set to Vvfymin, for example, if writing in the memory cells which are connected to the word line WL1 is performed, and the verification level is set to Vvfymin+dv, for example, if writing in the memory cells which are connected to the word lines WL2 and WL3 is performed. The verification level is set to Vvfymin+2dv, for example, if writing in the memory cells which are connected to the word lines WL4 and WL5 is performed, and the verification level is set to Vvfymin+3dv, for example, if writing in the memory cells which are connected to the word lines WL6 and WL7 is performed.

The shift amount of the verification level may be optimally set without being limited by the aforementioned method in which the shift amount increases in each two word lines, such that the upper limit of the threshold value distribution of a cell focused upon does not exceed the upper limit of the threshold voltage of memory cells connected to a word line, on which writing is previously performed.

Figure 8C:
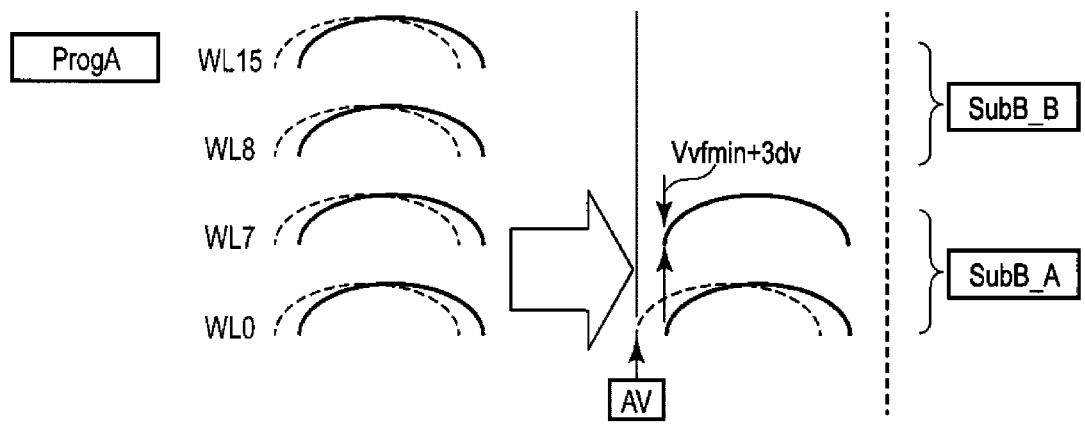
FIG. 8C is a diagram showing variation in the threshold voltage distribution during the sub-block writing operation according to the first embodiment.

FIG. 8C shows a case where data is written in the memory cells which are connected to the word line WL7 and shows a case where the verification level is set to Vvfymin+3dv and writing verification is executed.

Figure 8D:
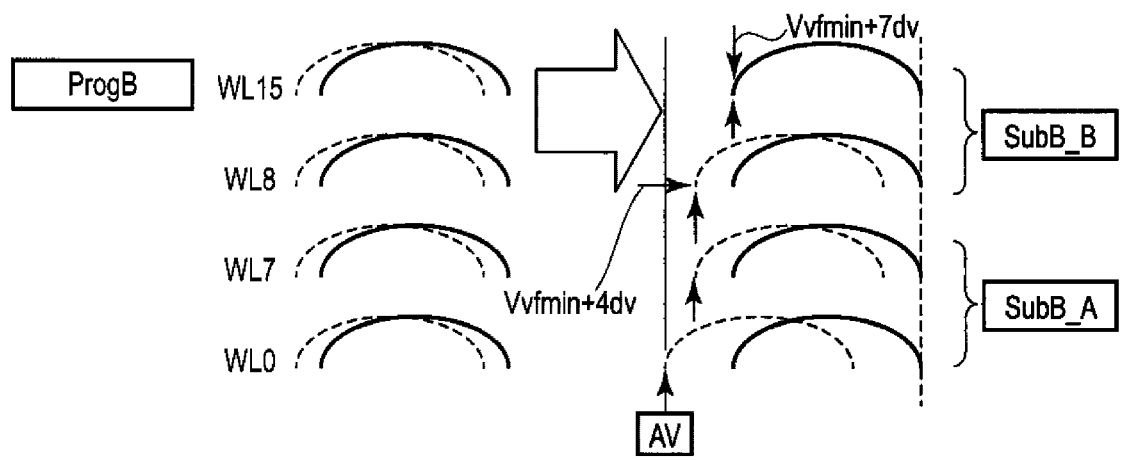
FIG. 8D is a diagram showing variation in the threshold voltage distribution during the sub-block writing operation according to the first embodiment.

FIG. 8D shows a state where writing in the word lines WL0 to WL7 is performed, a verification level of Vvfymin+4dv, for example, is applied to the word line WL8, and a verification level of Vvfymin+7dv is applied to the word line WL15 and writing is performed thereon if writing in the word lines WL8 to WL15 is performed.

Figure 8E:
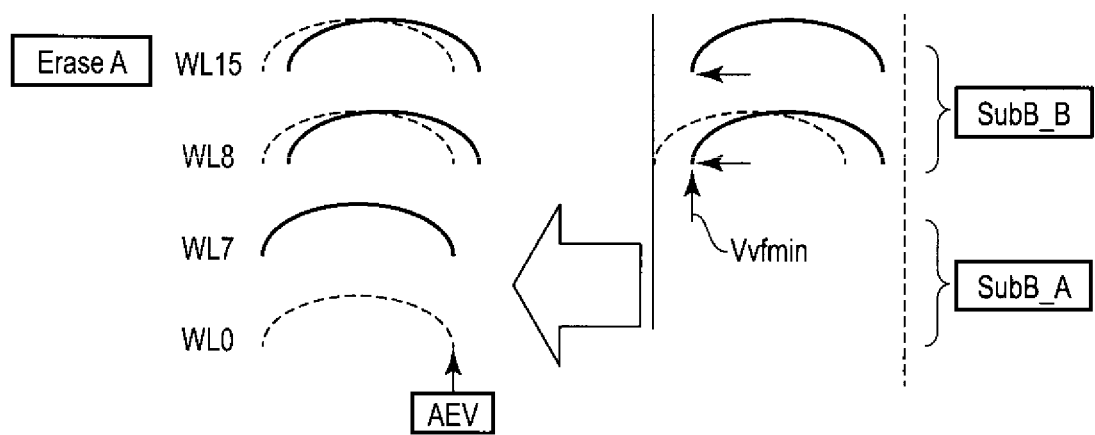
FIG. 8E is a diagram showing variation in the threshold voltage distribution during the sub-block writing operation according to the first embodiment.

Next, if an erasing operation from the word lines WL0 to WL7 is performed in FIG. 8E, the threshold voltage of the word lines WL8 to WL15 shifts to a side of lower threshold voltage as the back patterns of the word lines WL0 to WL7 are erased.

However, since the verification level is set to be higher by constant voltage ndv (n ranges from 1 to 7) in advance in the first embodiment, it is possible to prevent the distribution after the threshold voltage is lowered from being lowered below Vvfymin of the word line WL0.

Figure 8F:
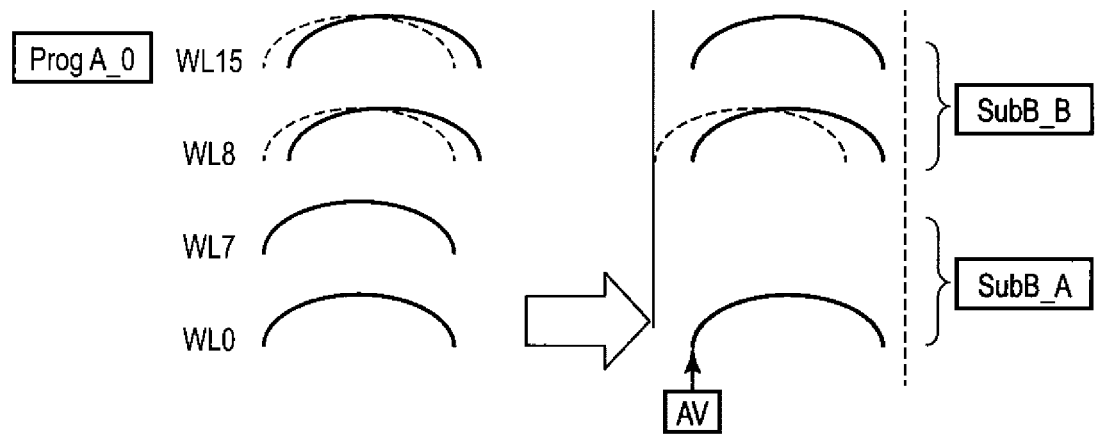
FIG. 8F is a diagram showing variation in the threshold voltage distribution during the sub-block writing operation according to the first embodiment.
Figure 8G:
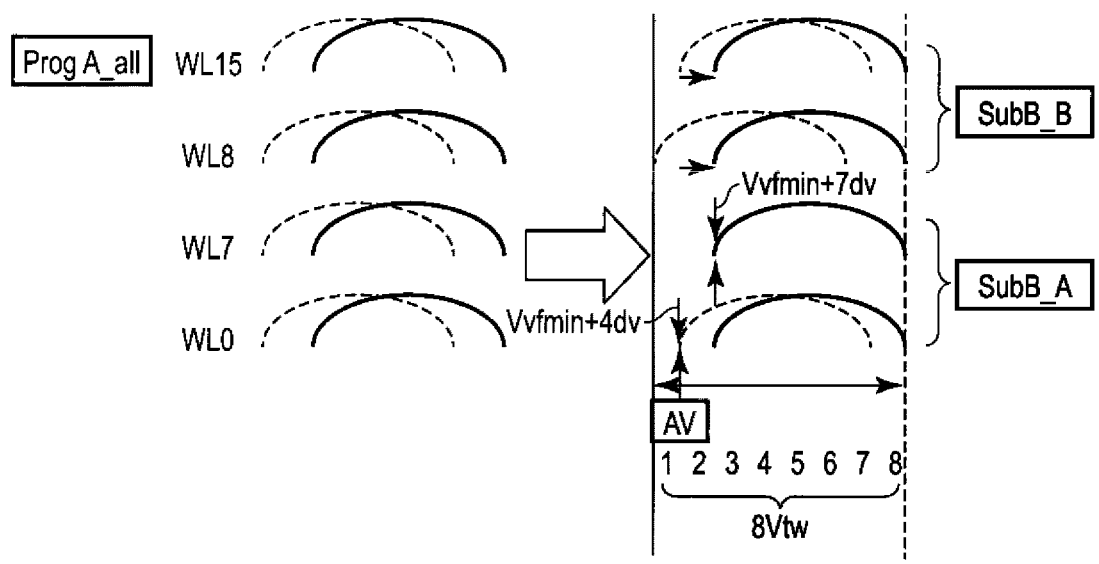
FIG. 8G is a diagram showing variation in the threshold voltage distribution during the sub-block writing operation according to the first embodiment.

Thereafter, writing in the memory cells which are connected to the word lines WL0 to WL7 is performed in FIGS. 8F and 8G, and control which is different from that in FIGS. 8B and 8C is applied while WL0 to WL7 are similarly the targets of writing.

If writing in the word lines WL0 to WL7 is performed in a state where writing in the memory cells which are connected to the word lines WL8 to WL15 has been performed, a verification level of Vvfymin+4dv, for example, is applied to the word line WL0, and a verification level of Vvfymin+7dv is applied to the word line WL15.

If other sub-blocks in a memory string focused upon are in the written state as described above, a relatively higher verification level is applied to a word line of a sub-block on which writing is performed later.

The range of the threshold voltage distribution in the A state in FIG. 8G is 8 Vtw, which is narrower than the range of the threshold voltage distribution in FIG. 6G in comparison in this state with the threshold voltage shown in FIG. 6G.

Figure 8H:
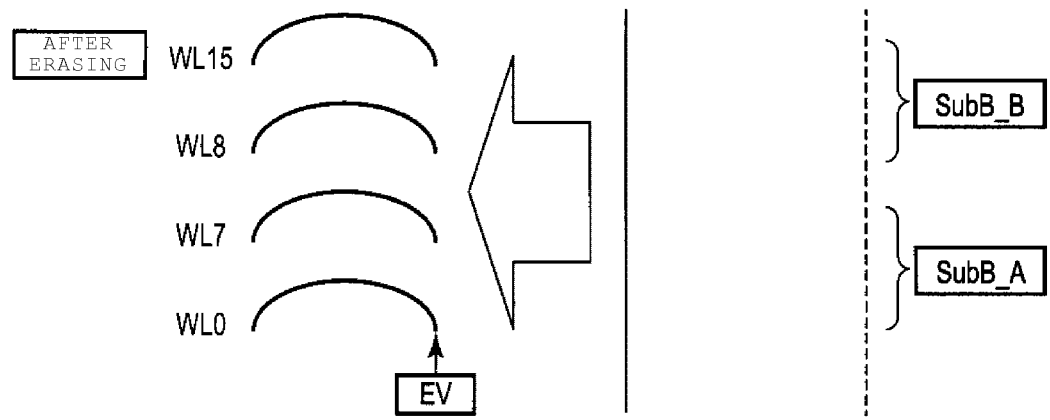
FIG. 8H is a diagram showing variation in the threshold voltage distribution during the sub-block writing operation according to the first embodiment.

Next, erasing from the entire sub-blocks SubB_A and SubB_B is performed as shown in FIG. 8H.

Figure 8I:
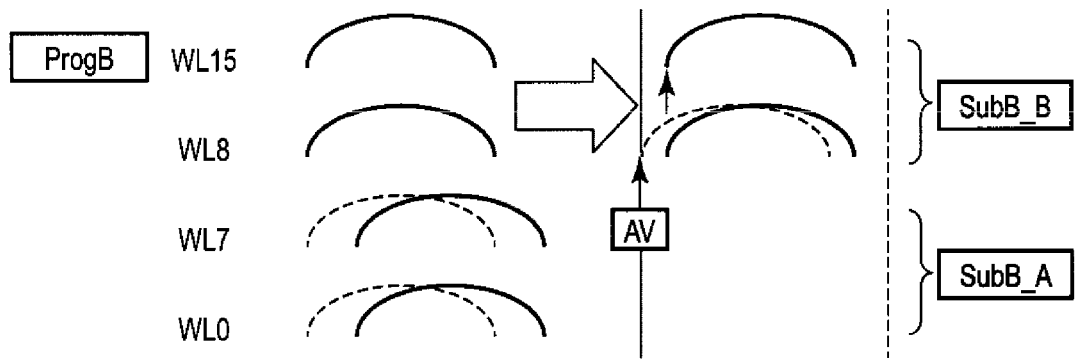
FIG. 8I is a diagram showing variation in the threshold voltage distribution during the sub-block writing operation according to the first embodiment.

Thereafter, writing in the memory cells which are connected to the word lines WL8 to WL15 is performed as shown in FIG. 8I.

Here, it is important that the verification level of the word line WL8 becomes Vvfymin if writing in the memory cells which are connected to the word lines WL0 to WL7 is not performed when writing in the memory cells which are connected to the word line WL8 is performed. In addition, Vvfymin+3dv is applied to the word line WL15. It is determined based on flag data whether writing in the sub-block SubB_A including the word lines WL0 to WL7 has been performed, and the verification level is controlled.

Here, the flag data means data written in one or a plurality of memory cells among the plurality of memory cells connected to the word line WL0, which functions as a flag cell. The flag data is written in a flag cell which is connected to the word line WL0 in the case of the sub-block SubB_A and is written in a flag cell which is connected to the word line WL8 in the case of the sub-block SubB_B. That is, when data is written in memory cells which are connected to the word lines WL0 or WL8, the flag data is written in a flag cell which is selected at the same time with the memory cells. The threshold voltage of the flag data is set to a level LM (an intermediate level between the level A and the level B), for example. The flag data is specified by the control circuit 15 in the chip shown in FIG. 1, for example, as described above, and the verification level control as described above is executed.

In addition, the verification level is not exclusively controlled by the control circuit 15, and the verification level may be controlled by causing a controller outside the chip to determine the flag data and issuing a command or changing parameter setting.

Figure 8J:
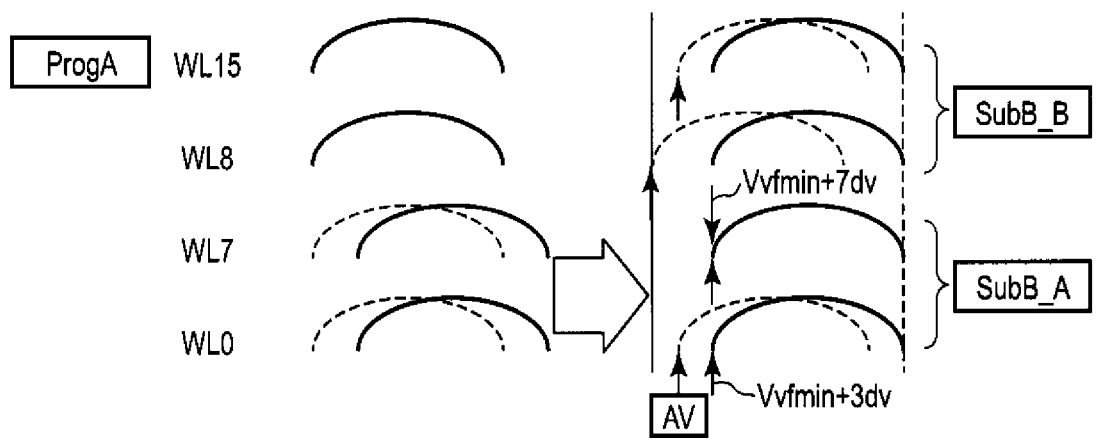
FIG. 8J is a diagram showing variation in the threshold voltage distribution during the sub-block writing operation according to the first embodiment.

Next, writing in an order from the word line WL0 to the word line WL7 is executed as shown in FIG. 8J. Since the writing in the order from the word line WL0 to the word line WL7 is executed after writing in the word lines WL8 to WL15 is performed, the verification level is changed in accordance with the writing in the word lines WL8 to WL15. That is, Vvfymin+4dv, for example, is applied to the word line WL0, and Vvfymin+7dv, for example, is applied to the word line WL7.

By setting the verification level as described above, it is possible to prevent the threshold value distribution width from expanding even if writing is performed after the erasing operation in units of the sub-blocks SubB_A and SubB_B.

Figure 9:
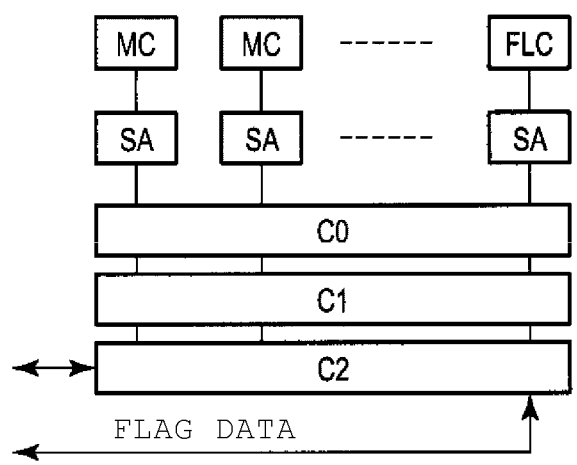
FIG. 9 is a configuration diagram showing an example of a relationship between memory cells and a flag cell and a relationship with cache memories.

FIG. 9 shows a relationship between memory cells and a flag cell in one page and a relationship with cache memories. The same reference numerals are assigned to the same components as those in FIG. 1.

As shown in FIG. 9, a flag cell FLC is provided in a page. That is, each page is configured to have a plurality of memory cells MC and a flag cell FLC. The number of flag cells is not limited to one, and a plurality of flag cells may be provided.

Each of the data circuits and page buffers 13 is configured to have a plurality of sense amplifiers SA and cache memories C0 to C2. The cache memory C2 is connected to the input and output circuit 16 to maintain written data or read data and the flag data. The flag data is exchanged with the control circuit 15 via the flag register 20.

Writing Operation

Figure 10:
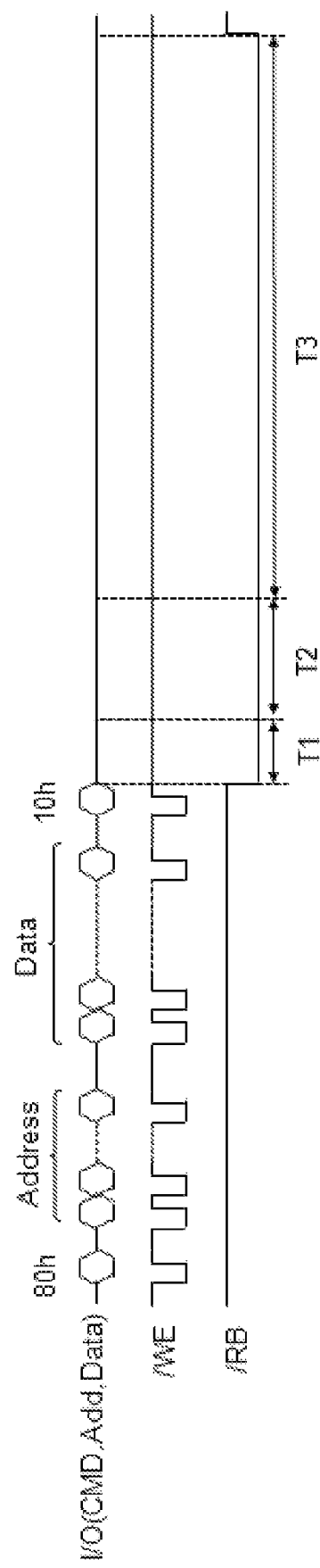
FIG. 10 is a timing chart showing an example of a writing operation according to the first embodiment.
Figure 11:
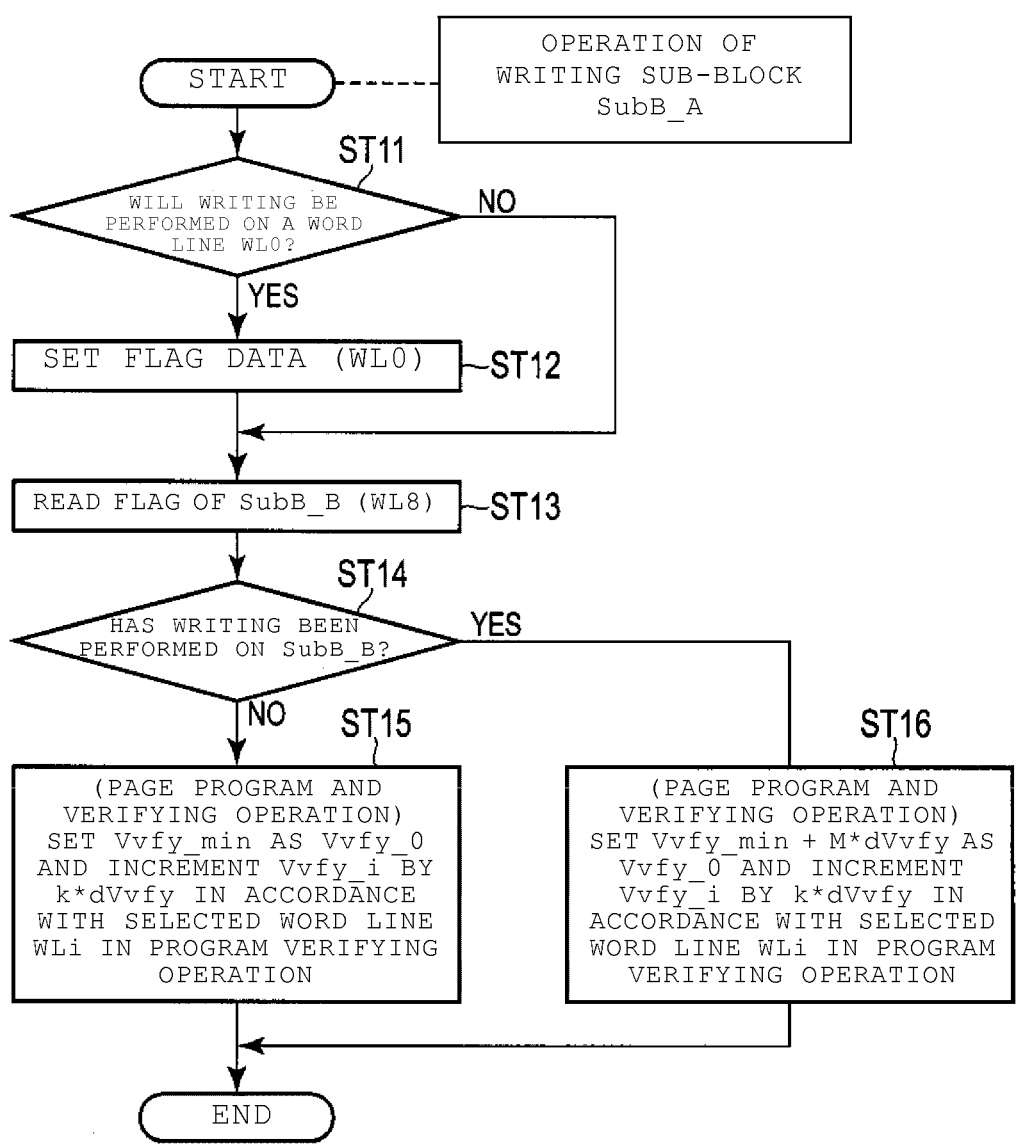
FIG. 11 is a flowchart showing an example of the writing operation according to the first embodiment.
Figure 12:
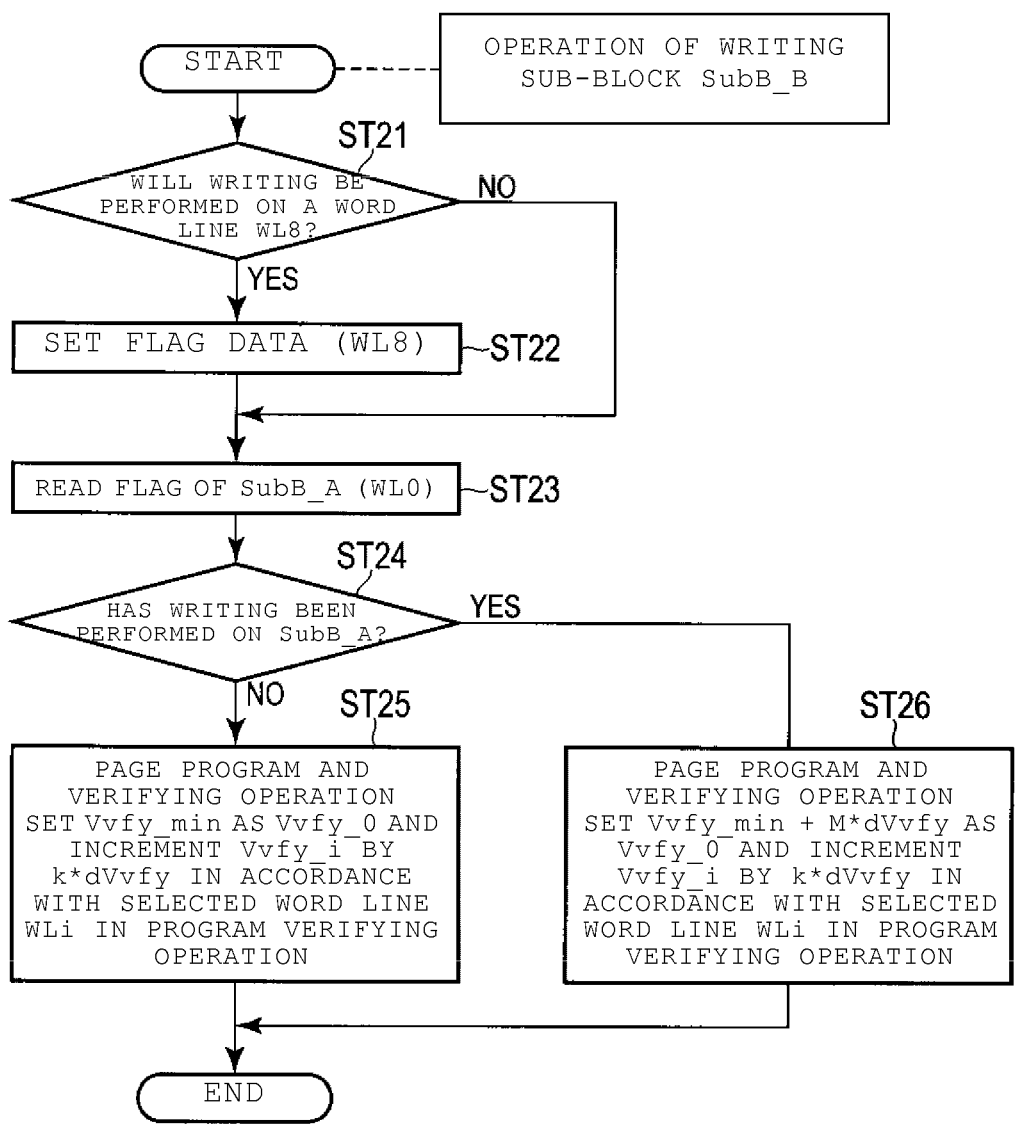
FIG. 12 is a flowchart showing an example of the writing operation according to the first embodiment.

Referring to FIGS. 10, 11, and 12, the aforementioned writing operation will be further described.

FIG. 10 shows an operation of the nonvolatile semiconductor memory device during writing. An external controller which is not shown in the drawing activates a light enabling signal /WE, issues a command "80h" which represents data loading, and outputs an address and data of a selected page. Thereafter, if a command "10h" which represents execution of a program is issued by the controller, the control circuit 15 brings a ready busy signal into a busy state (low level) and executes a writing operation.

During the writing operation, a period T1 is for processing for setting a flag. If a selected page address is the word line WL0 of the sub-block SubB_A or the word line WL8 of the sub-block SubB_B, flag data for writing flag data in the flag cell FLC is set in any of the cache memories C0 to C2 such that writing is performed at the same time with ordinary data writing which will be described later. That is, since it actually takes along time to perform writing if the writing operation is performed only on the flag cell FLC, only data setting for writing a flag is performed. Alternatively, flag data may be written in any pages.

Thereafter, the flag data in the other sub-block is read in a period T2 in order to determine whether or not data has been written in the other sub-block in the pair of the sub-blocks as writing targets. In accordance with the read flag data, the verification level is set.

Next, data is written in the selected page in a period T3, and program verification is executed based on the set verification level.

Program Operation of Sub-Block SubB_A

FIG. 11 shows operations in the periods T1 to T3 when the address of the selected page designates the word lines WL0 to WL7 of the sub-block SubB_A, for example.

First, it is determined whether or not the address of the selected page indicates the word line WL0 (ST11). If the address of the selected page indicates the word line WL0, processing for setting the flag data is executed (ST12). That is, the flag data is set by the flag register 20 shown in FIG. 1, and the flag data is set in a part corresponding to the flag cell FLC in the cache memory C2 shown in FIG. 9. Data loaded by the command "80h" is set in the other region in the cache memory C2.

On the other hand, if the address of the selected page designates the word lines WL1 to WL7 of the sub-block SubB_A, for example, the processing for setting the flag data is not executed.

Next, the flag data in the sub-block SubB_B is read in order to know whether data has been written in the sub-block SubB_B (ST13). That is, the word line WL8 of the sub-block SubB_B is selected, and the flag data is read from the flag cell FLC. The data is supplied to the flag register 20 via the cache memories C0 to C2.

The control circuit 15 determines whether the data has been written in the sub-block SubB_B based on the flag data which is stored in the flag register 20 (ST14).

If no data is written in the sub-block SubB_B as a result of the determination, the data is written in the memory string for the first time. Therefore, Vvfy_min is set as an initial value Vvfy_0 of the verification level, and a program and program verification of the memory cells which are connected to the word line WL0 are executed (ST15).

If no data has been written in the sub-block SubB_B, the verification levels Vvfy_i (i=1 to 7) of the subsequent word lines WL1 to WL7 are incremented by k*dVvfy (k=1 to 3), for example, as described above in accordance with the selected word line WLi.

On the other hand, if it is determined that data has been written in the sub-block SubB_B in Step ST14, Vvfy_min+ M*dVvfy (M=4, for example) is set as the initial value Vvfy_0 of the verification level, and the program and the program verification are executed (ST16). In addition, the value of M is set such that the number of word lines to which the same verification level is applied is a power of two.

If data has been written in the sub-block SubB_B, the verification levels Vvfy_i (i=1 to 7) of the subsequent word lines WL1 to WL7 are incremented by k*dVvfy (k=5 to 7), for example, as described above in accordance with the selected word line WLi.

Program Operation of Sub-Block SubB_B

FIG. 12 shows operations in the periods T1 to T3 when the address of the selected page designates the word lines WL0 to WL7 of the sub-block SubB_B.

First, it is determined whether or not the address of the selected page indicates the word line WL8 in this case (ST21). If the address of the selected page indicates the word line WL8 as a result, processing for setting flag data is executed (ST22). That is, the flag data is set by the flag register 20 shown in FIG. 1, and the flag data is set in a part corresponding to the flag cell FLC of the cache memory C2 shown in FIG. 9. Data loaded by the command "80h" is set in the other region of the cache memory C2.

On the other hand, if the address of the selected page designates the word lines WL9 to WL15 of the sub-block SubB_B, for example, the processing for setting the flag data is not executed.

Next, the flag data in the sub-block SubB_A is read in order to know whether data has been written in the sub-block SubB_A (ST23). That is, the word line WL0 of the sub-block SubB_A is selected, and the flag data is read from the flag cell FLC. The data is supplied to the flag register 20 via the cache memories C0 to C2.

The control circuit 15 determines whether or not data has been written in the sub-block SubB_Abased on the flag data which is stored in the flag register 20 (ST24).

If no data is written in the sub-block SubB_A as a result of the determination, data is written in the memory string for the first time. Therefore, Vvfy_min is set as an initial value Vvfy_0 of the verification level, and the program and the program verification of the memory cells which are connected to the word line WL8 are executed (ST25).

When no data is written in the sub-block SubB_A, the verification levels Vvfy_i (i=9 to 15) of the subsequent word lines WL9 to WL15 are incremented by k*dVvfy (k=1 to 3), for example, as described above in accordance with the selected word line WLi.

On the other hand, if it is determined that data has been written in the sub-block SubB_A in Step ST24, Vvfy_min+M*dVvfy (M=4, for example) is set as the initial value Vvfy_0 of the verification level, and the program and the program verification are executed (ST26).

If data has been written in the sub-block SubB_A, the verification levels Vvfy_i (i=9 to 15) of the subsequent word lines WL9 to WL15 are incremented by k*dVvfy (k=5 to 7), for example, as described above in accordance with the selected word line WLi. In the case of two sub-blocks as described above, a voltage range for adjusting the verification level is divided into two groups and used. That is, k*dVvfy (k=0 to 3) is a group of voltages for adjusting the lower verification level, and k*dVvfy (k=4 to 7) is a group of voltages for adjusting the higher verification level.

In addition, the verification level is divided into four groups, for example, if the number of sub-blocks is four. The verification level is selected from the four groups in accordance with the sub-block on which writing is to be performed, based on the following rule.

If the number of sub-blocks in which writing has been completed is zero, a group of the lowest verification level is selected.

If the number of sub-blocks in which writing has been completed is one, a group of the second lowest verification level is selected.

If the number of sub-blocks in which writing has been completed is two, a group of the third lowest verification level is selected.

If the number of sub-blocks in which writing has been completed is three, a group of the highest verification level is selected.

Figure 13:
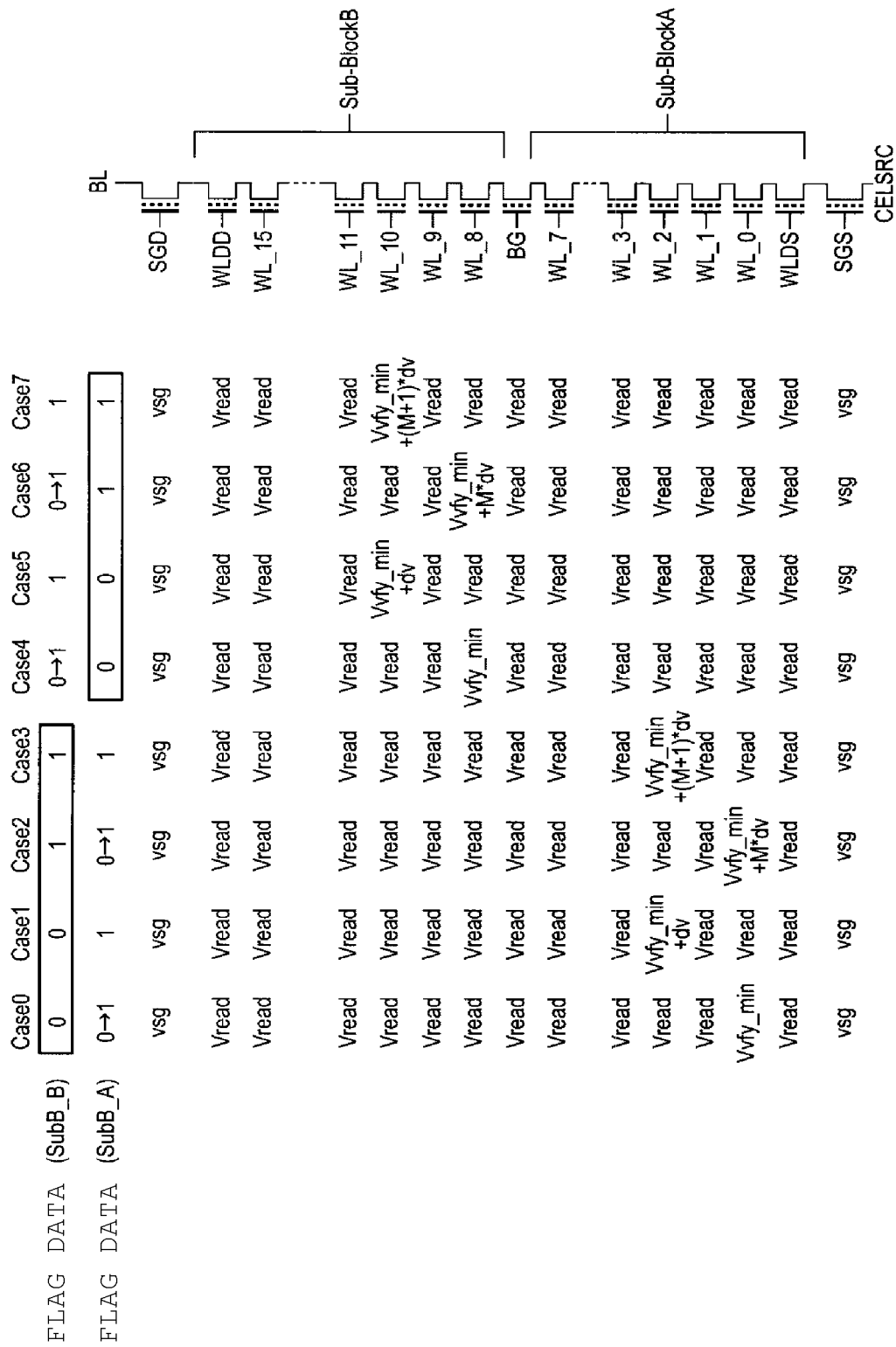
FIG. 13 is a diagram showing an example of the writing operation according to the first embodiment and showing a verification level in accordance with flag data.

FIG. 13 shows the entire above operations and shows verification levels in accordance with the flag data.

For example, Case 0 represents writing in the memory cells which are connected to the word line WL0 of the sub-block SubB_A. Since the flag data is zero, and no data has been written in the sub-block SubB_B in this case, the initial value of the verification level which is applied to the word line WL0 is set to Vvfy_min. Voltage Vread (reading pass voltage) is supplied to other word lines WL1 to WL 15. In addition, the flag data in the sub-block SubB_A indicates that writing of "1" instead of "0" is performed.

For example, Case 1 represents a case of writing in the memory cells which are connected to the word line WL2 when writing in the sub-block SubB_A has been performed (the flag data is "1"). Since the flag data of the sub-block SubB_B is "0" and no data has been written in the sub-block SubB_B in this case, the initial value of the verification level which is applied to the word line WL2 is set to Vvfy_min+dVvfy (dVvfy=dv is described in FIG. 13). The voltage Vread is supplied to other word lines WL0, WL1 to WL3, WL15, and the like.

For example, Case 2 represents writing in the memory cells which are connected to the word line WL0 of the sub-block SubB_A when writing in the sub-block SubB_B has been performed (the flag data is "1"). In this case, the initial value of the verification level of the word line WL0 is set to Vvfy_min+M*dVvfy. The voltage Vread is supplied to other word lines WL1 to WL15 and the like. In addition, the flag data in the sub-block SubB_A indicates that writing of "1" instead of "0" is performed.

For example, Case 3 represents a case of writing in the memory cells which are connected to the word line WL2 of the sub-block SubB_A in a state where writing in both the sub-blocks SubB_A and subB_B has been completed (both the flag data are "1"). In such a case, the initial value of the verification level of the word line WL2 is set to Vvfy_min+(M+1)*dVvfy. The voltage Vread is supplied to other word lines WL0, WL1, WL3 to WL15, and the like.

For example, Case 4 represents writing in the memory cells which are connected to the word line WL8 of the sub-block SubB_B. Since no data has been written in the sub-block SubB_A (the flag data "0"), the initial value of the verification level of the word line WL8 is set to Vvfy_min. The voltage Vread is supplied to other word lines WL0 to WL7, WL9 to WL15, and the like. In addition, the flag data of the sub-block SubB_B indicates that writing of "1" instead of "0" is performed.

For example, Case 5 represents a case of writing in the memory cells which are connected to the word line WL10 in a state where data has been written in the sub-block SubB_B (the flag data is "1"). Since no data has been written in the sub-block SubB_A (the flag data is "0"), the initial value of the verification level of the word line WL8 is set to Vvfy_min+dv. The voltage Vread is supplied to other word lines WL0 to WL9, WL11 to WL15, and the like.

For example, Case 6 represents a case of writing in the memory cells which are connected to the word line WL8 of the sub-block SubB_B in a state where data has been written in the sub-block SubB_A (the flag data is "1"). Since data has been written in the sub-block SubB_A in this case, the initial value of the verification level is set to Vvfy_min+M*dVvfy (dVvfy=dv is described in FIG. 13). The voltage Vread is supplied to other word lines WL0 to WL7, WL9 to WL15, and the like. In addition, the flag data in the sub-block SubB_B indicates that writing of "1" instead of "0" is performed.

For example, Case 7 represents a case of writing in the memory cells which are connected to the word line WL10 of the sub-block SubB_Bin a state where data has been written in both the sub-blocks SubB_A and SubB_B (both the flag data are "1"). Since data has been written in the sub-block SubB_A, the initial value of the verification level is set to Vvfy_min+(M+1)*dVvfy (dVvfy=dv is described in FIG. 13). The voltage Vread is supplied to other word lines WL0 to WL9, WL11 to WL15, and the like.

According to the above first embodiment, the nonvolatile semiconductor memory device in which the plurality of memory units MU (memory strings MS) aligned in the row direction are divided into the plurality of sub-blocks SubB_A and SubB_B and data is erased in units of sub-blocks, and the verification level to be supplied to a selected word line is changed during writing depending on whether or not data has been written in a non-selected sub-block by determining what the flag data of the non-selected sub-block which does not include a selected word line indicates. That is, the verification level when data has been written in the non-selected sub-block is set to be higher than the verification level when no data has been written in the non-selected sub-block. Therefore, it is possible to prevent the threshold voltage distribution range of the memory cells from expanding even when data in the sub-block in the memory unit MU is erased.

Although the verification level is controlled by the control circuit 15 in the above embodiment, the exemplary embodiments are not limited thereto, and the verification level may be controlled by an external controller.

Although the first embodiment in which the memory unit MU (memory string MS) has been divided into two sub-blocks has been described, it is possible to achieve the same effect as that in the first embodiment even in the case where the memory unit MU is divided into four or eight as described above by reading the flag data in the non-selected sub-block, determining whether or not data has been written in the non-selected sub-block, and setting the verification level of the selected word line.

Second Embodiment

Figure 14:
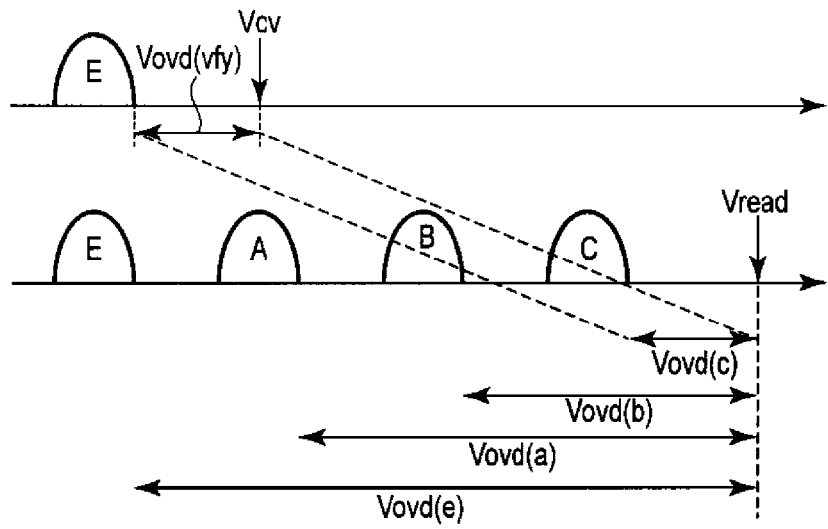
FIG. 14 is a diagram showing a relationship between a threshold voltage distribution in each state and a reading pass voltage according to a second embodiment.

FIG. 14 is a diagram showing a second embodiment and showing a relationship between a threshold voltage distribution in the states E, A, B, and C and the voltage Vread.

As described above, setting is made such that the voltage Vread is supplied to the word line to which the non-selected memory cells are connected and the cells are turned on even when the memory cells are set to have the threshold voltage in the C state in the program verification operation.

On-margin in the states E, A, B, and C with respect to the voltage Vread is assumed such that Vovd(e) represents the on-margin for the erasing distribution E, Vovd(a) represents the on-margin for the state A, Vovd(b) represents the on-margin for the B state, and Vovd(c) represents the on-margin for the C state as shown in FIG. 14.

In a basic procedure in which writing is performed in an order from a memory cell on the source side, the on-margin of Vread which is applied to a non-selected cell further toward the bit line side than a certain selected cell is Vovd (e) when writing verification is performed in the selected cell.

On the other hand, the on-margin with respect to Vread during the reading operation is Vovd(e) to Vovd(c) depending on written data. If many memory cells with the on-margin Vovd (c) are included, it becomes more difficult to cause cell current to flow through the non-selected cells in the memory string than in a case of writing verification, the cell current relatively decreases, and the aforementioned back pattern noise increases.

On the other hand, if many memory cells with the on-margin Vovd(e) are included, the same state as the state during the writing verification is maintained, variations in the cell current decreases, and the back pattern noise decreases.

Here, if Vread during the writing verification is lowered to voltage Vcv (Vovd (b)<Vcv<Vovd (c), for example) as shown in FIG. 14, the on-margin of the non-selected cell parts becomes Vovd (vfy) and can be maintained in an intermediate state between Vovd(e) and Vovd(c) which are on-margins during the reading operation. This means that the back pattern noise can be positive and negative.

The second embodiment is an example in which the writing verification is controlled by using the voltage Vread (first reading pass voltage) and voltage Vcv (second reading pass voltage) which is lower than the voltage Vread.

If data is written in the word line WL0 from an erased state and the sub-block SubB_B to which the word line WL0 does not belong is in the erased state, reading pass voltage Vcv which is lower than the voltage Vread can be applied to the word lines WL2 to WL15, for example, other than the word line WL0.

Here, the reading pass voltage Vcv is assumed to be voltage in a relationship of Vovd(vfy)≈Vovd(c) in FIG. 14. In this case, the threshold voltage of the non-selected cells to which the voltage Vcv is applied is in the erased state (erasing distribution E) during the verifying reading operation. Although the cells to which the voltage Vcv is applied are in the on state, the cell current is smaller than that in the case of applying the voltage Vread.

On the other hand, since the voltage Vread is applied to the non-selected cells during the reading operation, approximately the same cell current as that in the verification flows through the cells on which writing has been performed so as to have the threshold voltage in the C state. However, a relatively larger current than that during the verification reading in the on state flows through the cells on which writing has been performed so as to have the threshold voltage in the states E to B. Accordingly, if any of the threshold voltages in the states E to C tend to be random and writing is performed by using the voltage Vcv as described above, the back pattern noise generally causes the threshold voltage distribution to shift to the lower potential side.

A description will be given of operations according to the second embodiment with reference to FIGS. 15A to 15J, 16, and 17. In addition, the same reference numerals as those in FIGS. 11 and 12 are assigned to the same components in FIGS. 16 and 17, and a detailed description will be omitted.

FIGS. 15A to 15J show a threshold voltage distribution when writing and erasing operations according to the second embodiment are performed, and shows the threshold voltage distribution of the memory cells controlled by the representative word line WL0 and the word line WL7 which belong to the sub-block SubB_A and threshold voltage distribution of the memory cells controlled by the word lines WL8 and WL15 which belong to the sub-block SubB_B.

Program Operation of Sub-Block SubB_A

Figure 15A:
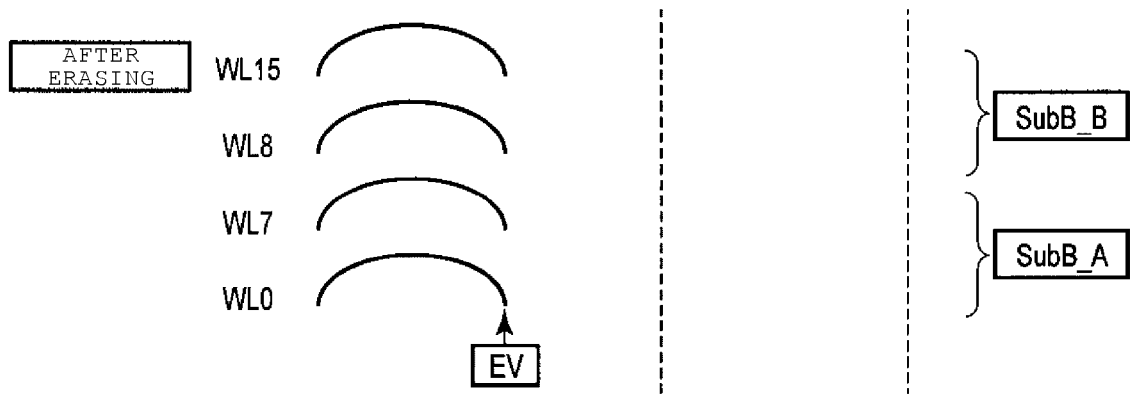
FIG. 15A is a diagram showing variation in threshold voltage distribution during a sub-block writing operation according to the second embodiment.

FIG. 15A shows a state after erasing from both the sub-blocks SubB_A and SubB_B, and the threshold voltage of each memory cell is in an erasing level, namely the E state.

If data is written in the memory cells connected to the word line WL0 which belongs to the sub-block SubB_A from this state (ST11), processing for setting the flag data is executed (ST12).

Then, the flag data is read from the flag cell FLC which is connected to the word line WL8 (ST13), and it is determined whether or not erasing from the sub-block SubB_B has been performed (ST31).

If erasing from the sub-block SubB_B has been determined to be performed as a result, data is written in the memory cells which are connected to the selected word line WL0, the flag data is written in the flag cell FLC and writing verification is then performed (ST32). During the writing verification for the word line WL0, verification voltage Vvfy is supplied to the word line WL0, the voltage Vread, for example, is supplied to the word line WL1 and the voltage Vcv is supplied to the word lines WL2 to WL15 in the erased state.

Figure 15B:
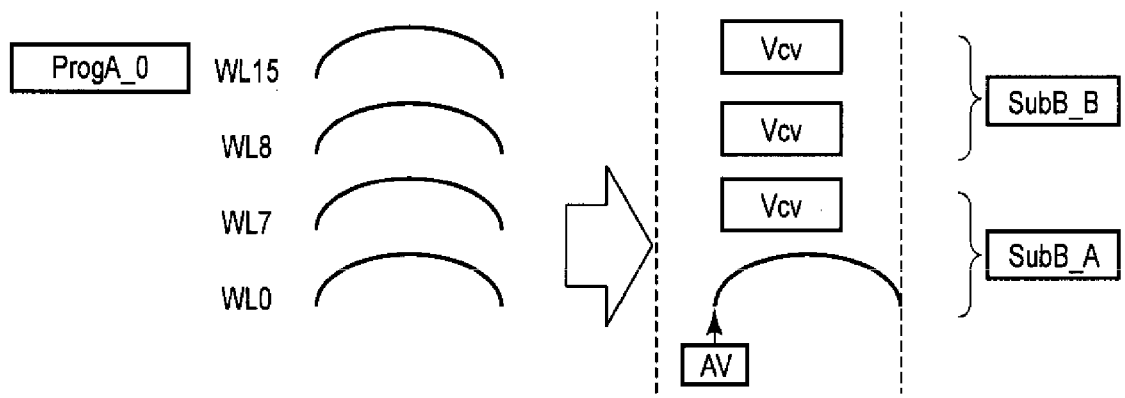
FIG. 15B is a diagram showing variation in the threshold voltage distribution during the sub-block writing operation according to the second embodiment.

FIG. 15B shows a threshold voltage after selecting the word line WL0 and performing writing and writing verification thereon. During the writing verification, the voltage Vcv is applied from the non-selected word line WL2 which is away from the selected word line WL0 by a predetermined number, for example, two to the word line WL15.

As described above, writing in the word line WL1 and the subsequent word lines within the sub-block SubB_A is sequentially performed. If the selected word line is WLn at this time, the voltage Vcv is supplied to the word lines WLn+2 to WL15, and the voltage Vread is supplied to the word line WLn+1 during the writing verification.

Figure 15C:
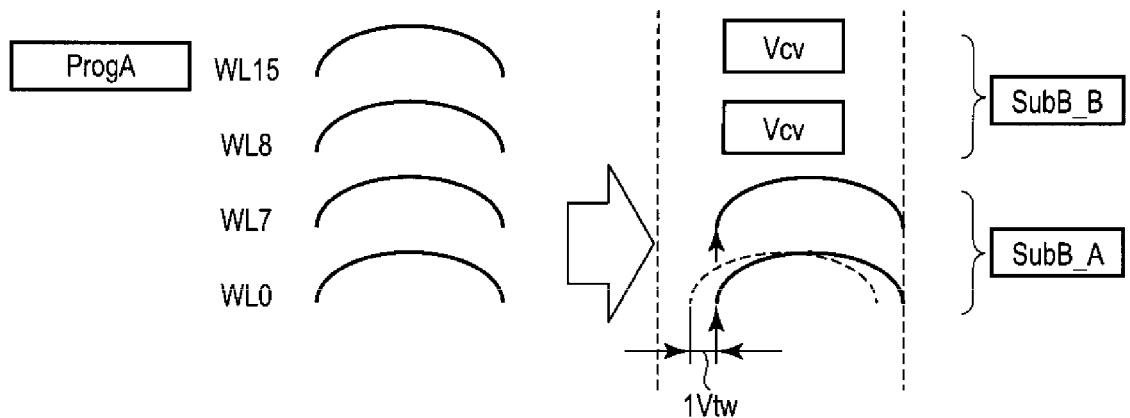
FIG. 15C is a diagram showing variation in the threshold voltage distribution during the sub-block writing operation according to the second embodiment.

FIG. 15C shows a threshold voltage after performing writing in an order from the word line WL0 to the word line WL7. Since the threshold voltage distribution of the word line WL7 corresponds to threshold voltage distribution immediately after writing, the threshold voltage distribution is present on a side which is higher than the targeted verification level AV.

On the other hand, the threshold voltage distribution of the word line WL0 is in a state where the threshold voltage is slightly deviated from the threshold voltage distribution immediately after the writing in the word line WL0 due to the writing in an order from the word line WL1 to the word line WL7. That is, if the non-selected word line is set to have the voltage Vcv, the threshold voltage distribution expands on a side which is lower than the threshold voltage distribution immediately after writing as shown by a broken line in FIG. 15C. If the shift amount of the threshold voltage due to the writing operation for one sub-block (eight word lines) is defined to be 1 Vtw in the description, the shift amount of the threshold voltage of the word line WL0 becomes 1 Vtw.

In addition, if erasing from the sub-block SubB_B has been not performed in Step ST14, processing proceeds to the control in Step ST33. An operation in Step ST33 will be described later.

Program Operation of Sub-Block SubB_B

Figure 17:
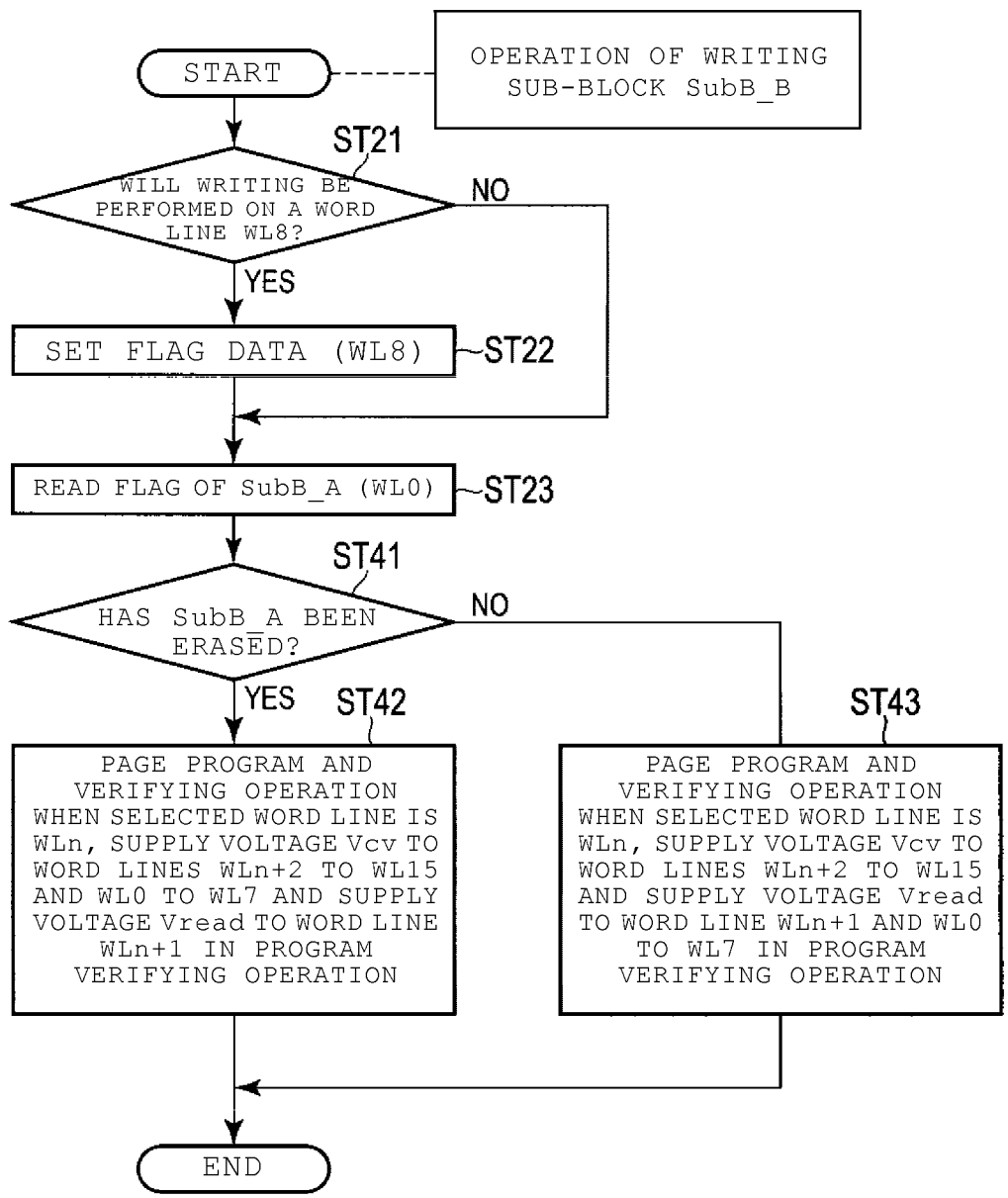
FIG. 17 is a flowchart showing an example of the writing operation according to the second embodiment.

Next, if it is determined that data is to be written in the memory cells which are connected to the word line WL8 of the sub-block SubB_B in Step ST21 shown in FIG. 17 (ST21), the processing for setting the flag data is executed (ST22).

Then, the flag data is read from the flag cell FLC which is connected to the word line WL0 (ST23), and it is determined whether or not erasing from the sub-block SubB_A has been performed (ST41).

Since it is determined that data has been already written in the sub-block SubB_A as a result of the determination, data is written in the memory cells which are connected to the selected word line WL0, and writing verification is then performed (ST43). During the writing verification of the word line WL8, the verification voltage Vvfy is supplied to the word line WL8, the voltage Vread, for example, is supplied to the word lines WL9 and WL0 to WL7, and the voltage Vcv is supplied to the word lines WL10 to WL15 in the erased state.

Writing in the word line WL9 and subsequent word lines within the sub-block SubB_B is sequentially performed as described above. If the selected word line is WLn at this time, the voltage Vcv is supplied to the word lines WLn+2 to WL15, and the voltage Vread is supplied to the word lines WLn+1 and WL0 to WL7 during the writing verification.

Figure 15D:
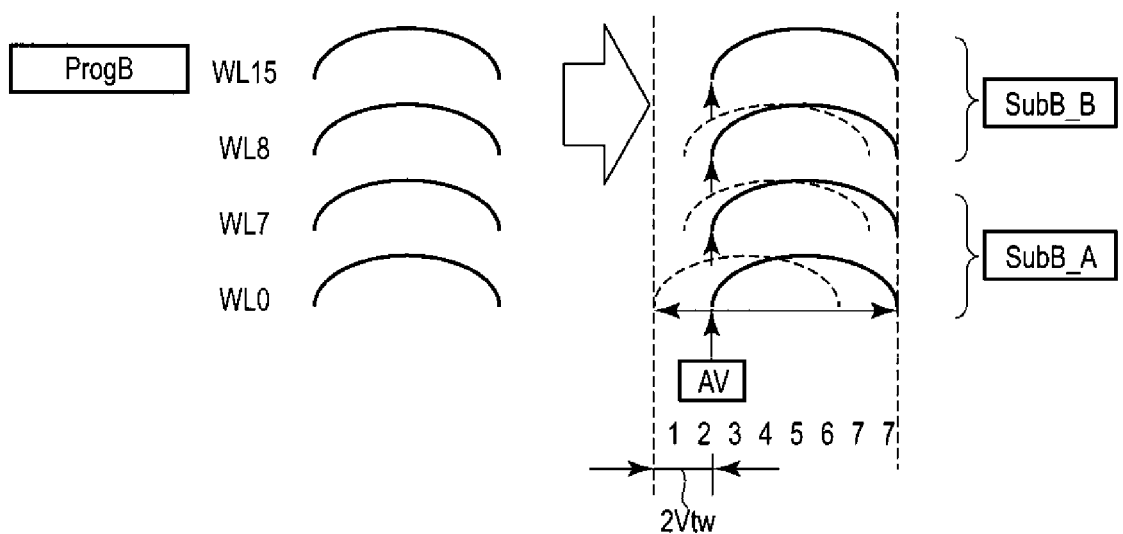
FIG. 15D is a diagram showing variation in the threshold voltage distribution during the sub-block writing operation according to the second embodiment.

FIG. 15D shows a threshold voltage after performing writing on the eight word lines WL8 to WL15 which belong to the sub-block SubB_B. In such a case, the threshold voltage distribution of the word line WL0 expands to a lower side as compared with a state in FIG. 15C. The shift amount in this case is 2 Vtw.

Figure 15E:
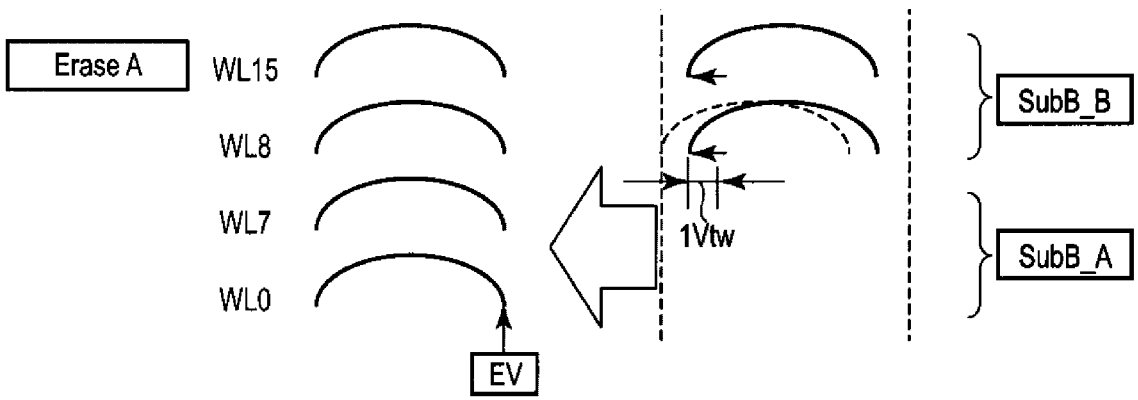
FIG. 15E is a diagram showing variation in the threshold voltage distribution during the sub-block writing operation according to the second embodiment.

FIG. 15E shows a threshold voltage after performing erasing from the sub-block SubB_A. Here, the threshold voltage distribution of the word lines WL8 to WL15 which belong to the sub-block SubB_B entirely shifts to the lower side by about 1 Vtw. At this time, the lowest part in the threshold voltage distribution of the word line WL8 is lowered by about 1 Vtw before and after the erasing. However, the position of the threshold voltage distribution can be expected to be substantially the same as the lowest part in the threshold voltage distribution of the word line WL0 shown in FIG. 15D. This is because writing is performed after the writing in the sub-block SubB_A and the position of the threshold voltage distribution of the word line WL8 is different from the position of the threshold voltage distribution of the word line WL0 by about 1 Vtw.

Program Operation of Sub-Block SubB_A: ST33

Figure 16:
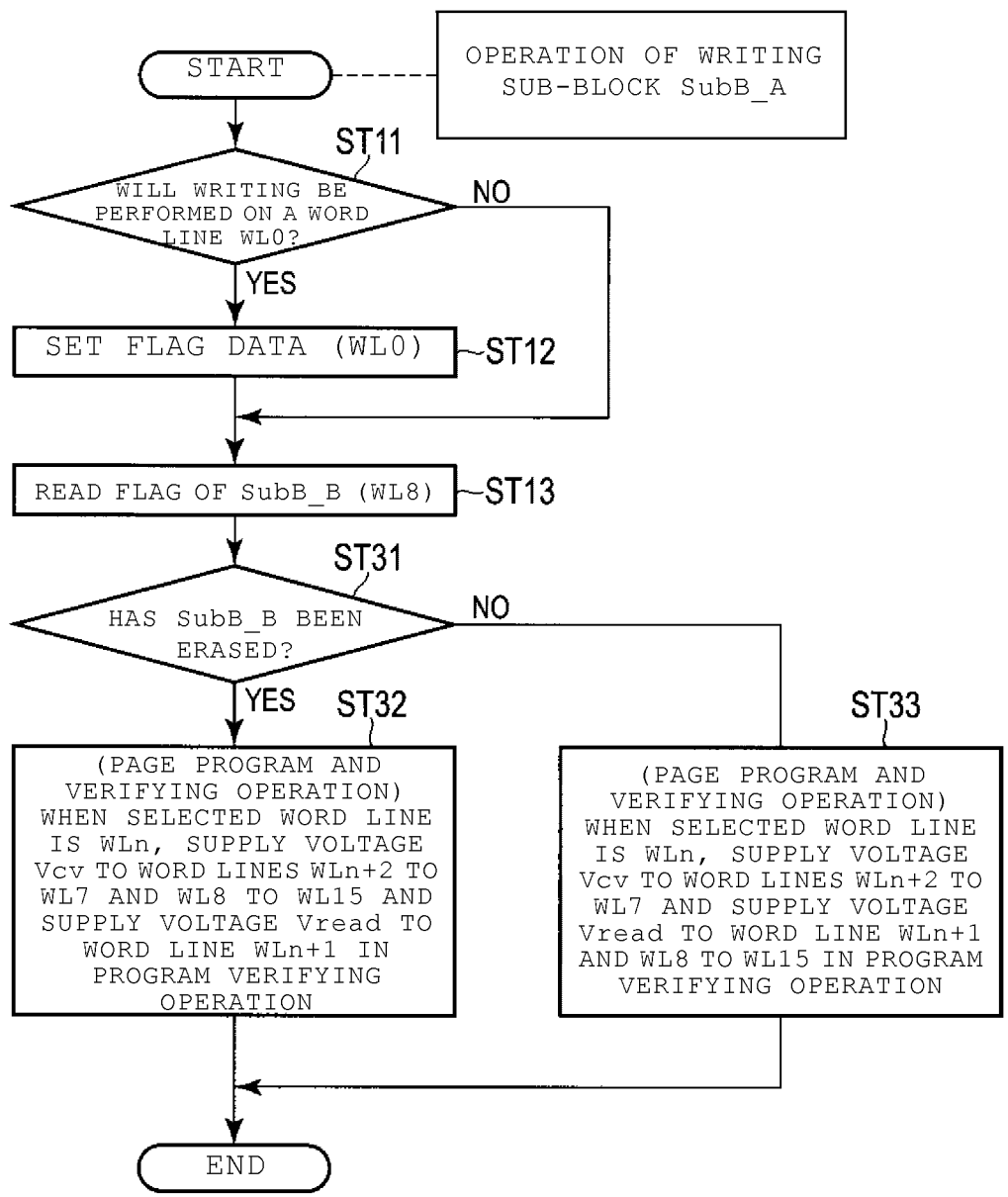
FIG. 16 is a flowchart showing an example of a writing operation according to the second embodiment.

If data is written again in the memory cells which are connected to the word line WL0 after erasing from the sub-block SubB_A is performed, Steps ST11 to ST13 shown in FIG. 16 are executed as described above, and it is determined whether or not erasing from the sub-block SubB_B has been performed in Step ST31.

Since it is determined that erasing from the sub-block SubB_B has been not performed as a result, processing proceeds to control in Step ST33, and writing and writing verification for the word line WL0 are executed. During the writing verification, the verification voltage Vvfy is supplied to the word line WL0, the voltage Vread is supplied to the word lines WL1 and WL8 to WL15, and the voltage Vcv is supplied to the word lines WL2 to WL7.

Figure 15F:
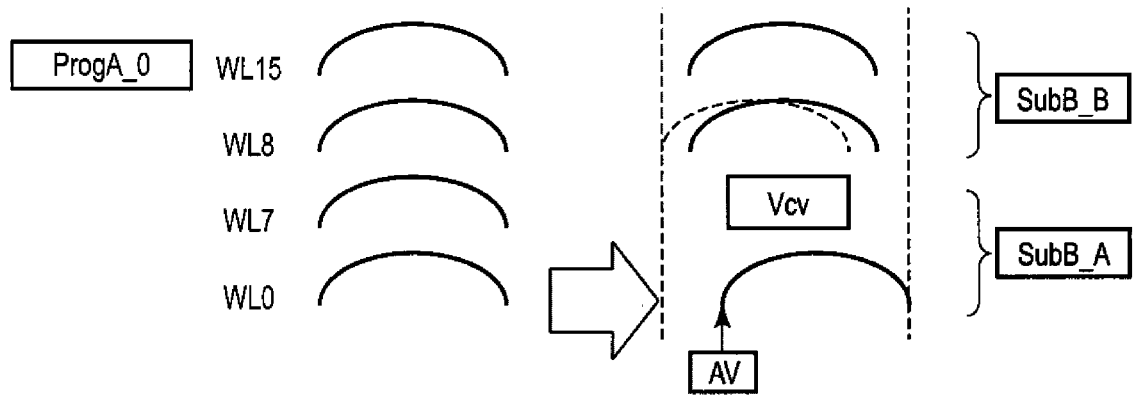
FIG. 15F is a diagram showing variation in the threshold voltage distribution during the sub-block writing operation according to the second embodiment.

FIG. 15F shows a case of performing the writing operation again on the word line WL0 of the sub-block SubB_A. Since the word lines WL2 to WL7 which are away from the selected word line by two word lines, for example, among the non-selected word lines within the selected sub-block SubB_A are in the erased state, the voltage Vcv is applied thereto.

Thereafter, data is written in the memory cells which are connected to the word lines WL1 to WL7 of the sub-block SubB_A. If the selected word line is WLn in this case, the voltage Vcv is supplied to the word lines WLn+2 to WL7, and the voltage Vread is supplied to the word lines WLn+1 and WL8 to WL15.

Figure 15G:
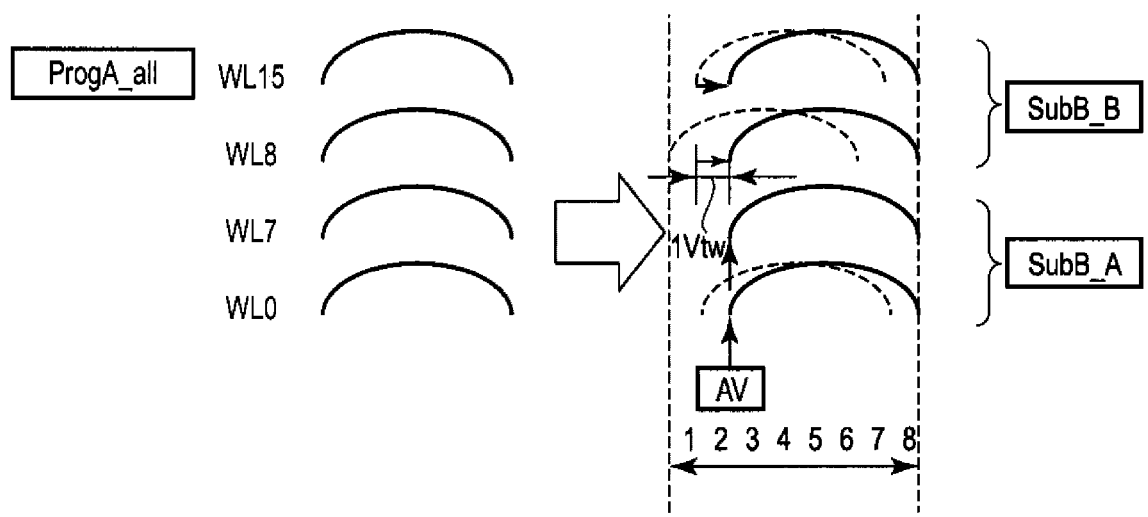
FIG. 15G is a diagram showing variation in the threshold voltage distribution during the sub-block writing operation according to the second embodiment.

FIG. 15G shows a threshold voltage after performing writing on all the word lines in the sub-block SubB_A. Here, if average writing is performed on the word lines WL1 to WL7 so as to have threshold voltages in the E to C states after the writing in the word line WL0, the threshold voltage distribution of the word line WL0 tends to be lowered. If data is written in all the word lines WL1 to WL7 in the same memory string so as to have the threshold voltage in the C state, the threshold voltage distribution immediately after the writing is maintained.

On the other hand, in the threshold voltage distribution of the sub-block SubB_B, the lowest part in the threshold voltage distribution of the word line WL8 corresponds to a case where average data writing is performed in a string focused upon in the sub-block SubB_B. If average data writing in the sub-block SubB_A has been not performed, that is, in a case of data writing which substantially maintains the erased state, the lowest part in the threshold voltage distribution of the word line WL8 is maintained at that position. On the other hand, if average data writing in SubB_A has been performed, an increase in the threshold voltage distribution of about 1 Vtw is observed.

As described above, it is possible to control the width of the threshold voltage distribution focused upon in the written state to about 8 Vtw.

Program Operation of Sub-Block SubB_B: ST42

Figure 15H:
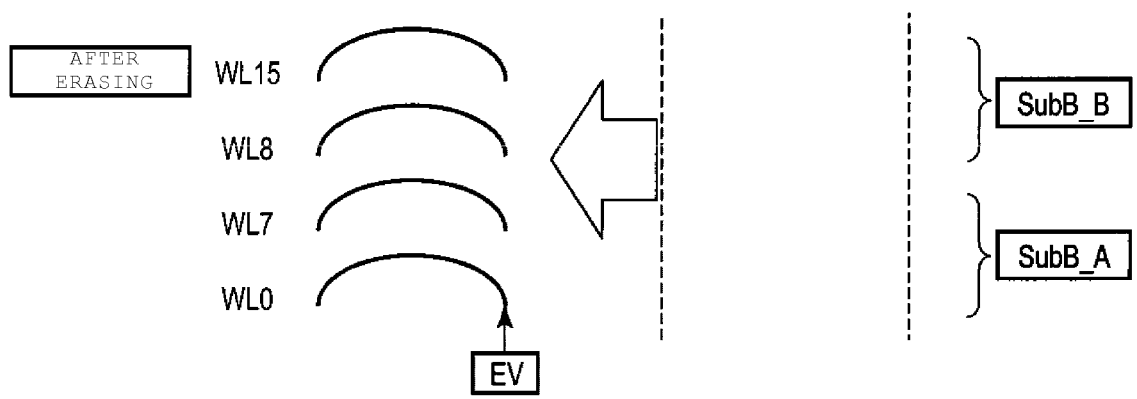
FIG. 15H is a diagram showing variation in the threshold voltage distribution during the sub-block writing operation according to the second embodiment.

FIG. 15H shows a state where erasing from both the sub-blocks SubB_A and subB_B has been performed.

If data is written in the sub-block SubB_B in this state, Step ST21 to ST23 in FIG. 17 are executed as described above, and it is determined whether or not erasing from the sub-block SubB_A has been performed (ST41).

Since it is determined that erasing from the sub-block SubB_A has been performed as a result, processing proceeds to control in Step ST42, and writing and writing verification for the sub-block SubB_B are executed in an order from the word line WL8 (ST42). During the writing verification, the verification voltage Vvfy is supplied to the word line WL8, the voltage Vread is supplied to the word line WL9, and the voltage Vcv is supplied to the word lines WL10 to WL15 and WL0 to WL7.

Next, writing and writing verification for the word lines WL9 to WL15 are executed. If the selected word line is WLn at this time, the voltage Vread is supplied to the word line WLn+1, and the voltage Vcv is supplied to the word lines WLn+2 to WL15 and WL0 to WL7.

Figure 15I:
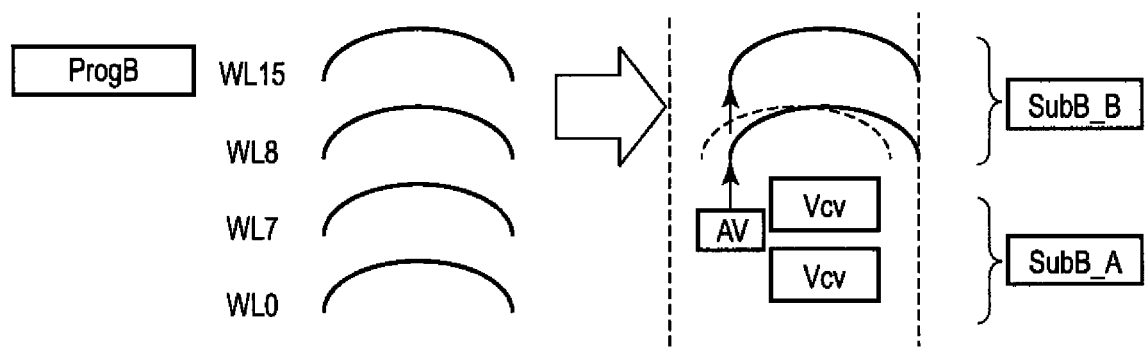
FIG. 15I is a diagram showing variation in the threshold voltage distribution during the sub-block writing operation according to the second embodiment.

FIG. 15I shows a case of performing the writing operation again on the word lines WL8 to WL15 of the sub-block SubB_B. Since the non-selected word lines WL0 to WL7 in the non-selected sub-block SubB_A are in the erased state in this case, the voltage Vcv is applied thereto.

Program Operation of Sub-Block SubB_A: ST33

Thereafter, data is written in the memory cells which are connected to the word lines WL1 to WL7 of the sub-block SubB_A based on Step ST33.

Figure 15J:
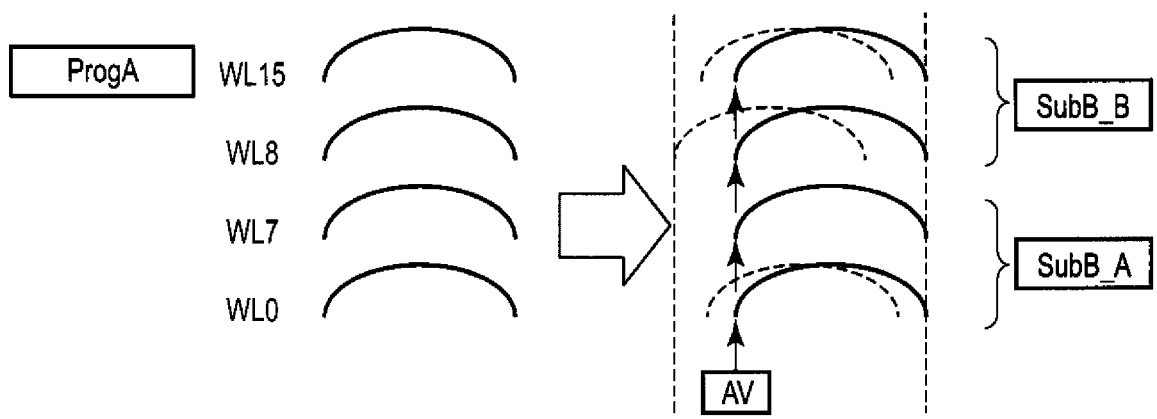
FIG. 15J is a diagram showing variation in the threshold voltage distribution during the sub-block writing operation according to the second embodiment.

FIG. 15J shows a state where data has been written in the word lines WL0 to WL7.

Figure 18:
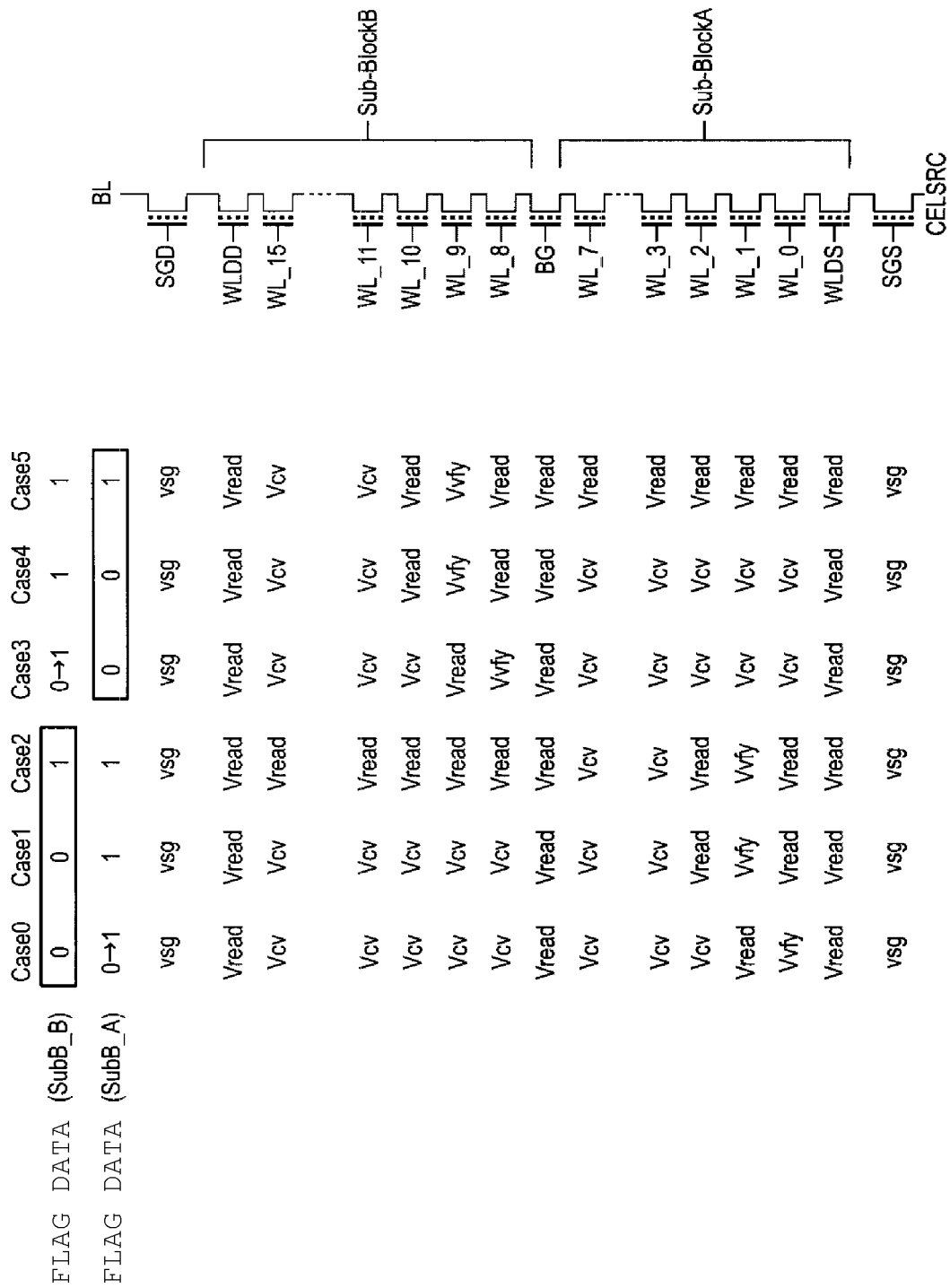
FIG. 18 is a diagram showing an example of the writing operation according to the second embodiment and showing verification levels in accordance with flag data.

FIG. 18 shows all the above operations and shows the verification levels based on the flag data.

For example, Case 0 represents writing in the memory cells which are connected to the word line WL0 of the sub-block SubB_A. Since the flag data is "0" and no data has been written in the sub-block SubB_B in this case, the verification level to be applied to the word line WL0 is set to Vvfy. The voltage Vread is supplied to the word line WL1, and the voltage Vcv is supplied to the word lines WL2 to WL15. In addition, the flag data in the sub-block SubB_A indicates that writing of "1" instead of "0" is performed.

For example, Case 1 represents writing in the memory cells which are connected to the word line WL1 of the sub-block SubB_A. In such a case, the flag data of "1" is written in the sub-block SubB_A, and no flag data is written in the sub-block SubB_B. The verification level of the word line WL1 is set to Vvfy, the voltage Vread is supplied to the word lines WL0 and WL2, and the voltage Vcv is supplied to the word lines WL3 to WL7 and WL8 to WL15.

For example, Case 2 represents writing in the memory cells which are connected to the word line WL1 of the sub-block SubB_A. In such a case, both the flag data are "1", and data has been written in both the sub-blocks SubB_A and SubB_B. The verification level of the word line WL1 is set to Vvfy, the voltage Vread is supplied to the word lines WL0, WL2, and WL8 to WL15, and the voltage Vcv is supplied to the word lines WL3 to WL7.

For example, Case 3 represents writing in the memory cells which are connected to the word line WL8 of the sub-block SubB_B. In such a case, the flag data is "0", and no data is written in the sub-block SubB_A. The verification level of the word line WL8 is set to Vvfy, the voltage Vread is supplied to the word line WL9, and the voltage Vcv is supplied to the word lines WL0 to WL7 and WL10 to WL15. In addition, the flag data in the sub-block SubB_B indicates that writing of "1" instead of "0" is performed.

For example, Case 4 represents writing in the memory cells which are connected to the word line WL9 of the sub-block SubB_B. Case 4 represents a state where data has been written in the sub-block SubB_B (the flag data is "1") while no data has been written in the sub-block SubB_A (the flag data is "0"). The verification level of the word line WL9 is set to Vvfy, the voltage Vread is supplied to the word lines WL8 and WL10, and the voltage Vcv is supplied to the word lines WL0 to WL7 and WL11 to WL15.

For example, Case 5 represents writing in the memory cells which are connected to the word line WL9 of the sub-block SubB_B. In such a case, both the flag data are "1", and data has been written in both the sub-blocks SubB_A and SubB_B. The verification level of the word line WL9 is set to Vvfy, the voltage Vread is supplied to the word lines WL0 to WL8, and Vcv is supplied to the word lines WL11 to WL15.

According to the second embodiment, it is possible to suppress the shift amount of the threshold voltage distribution in the rising direction by applying voltage Vcv lower than the voltage Vread to the non-selected word lines in the selected sub-block and the word lines to which the memory cells in the non-selected sub-block in the erased state are connected when data is written. Therefore, it is possible to suppress the threshold voltage distribution within a range of 8 Vtw, for example, and narrow the width of the threshold voltage distribution.

Specifically, if data has been written in all the memory cells in the memory string regarding threshold voltage distribution immediately after the writing in the examples shown in FIGS. 6A to 6G, the threshold voltage of the word line WL0 raises by about 2 Vtw, the threshold voltage of other word lines WL7 and WL8 raises by 1 Vtw, and no change occurs in the threshold voltage of the word line WL15 as shown in FIG. 6D. Thereafter, if erasing from the sub-block is performed, the threshold voltage distribution of the word lines WL8 to WL15 is lowered by about 1 Vtw. As a result, the threshold voltage distribution expands by about 3 Vtw.

On the other hand, if data has been written in all the memory cells in the memory string as shown in FIG. 15D, there is a possibility that the threshold voltage of the word line WL0 is lowered by about 2 Vtw and that the threshold voltage of the word lines WL7 and WL8 is lowered by 1 Vtw, and no change occurs in the threshold voltage of the word line WL15 according to the second embodiment. However, all the variations in the threshold voltage distribution of the word lines WL0 to WL15 are in a threshold voltage range of 2 Vtw. Therefore, if erasing from the sub-block SubB_A is performed later, the threshold voltage of the word lines WL8 to WL15 is lowered by about 1 Vtw. However, the range of the variations in the threshold voltage distribution overlaps with 2 Vtw as described above, and expansion of the distribution is restricted.

Third Embodiment

Figure 19:
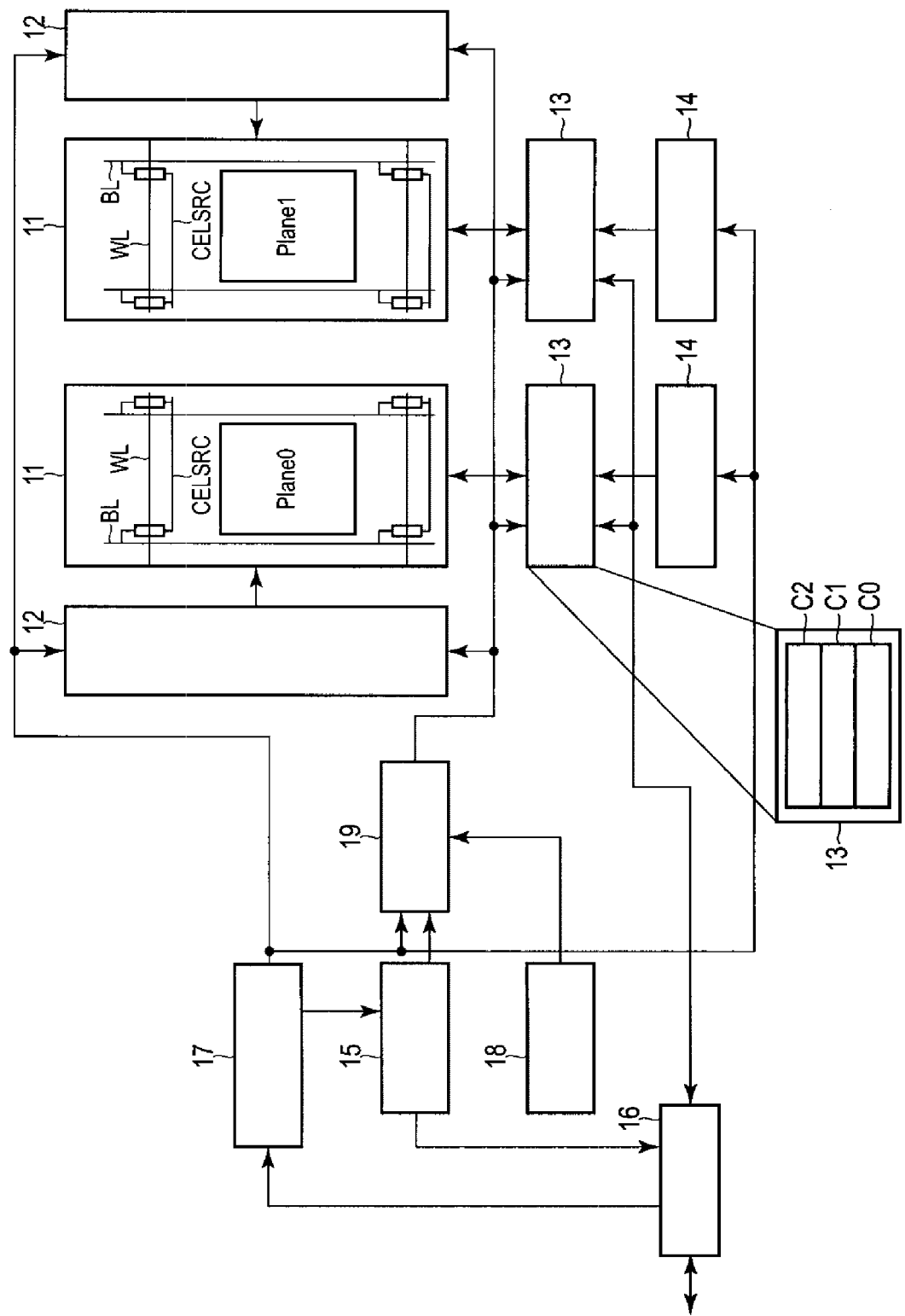
FIG. 19 is a configuration diagram schematically showing a nonvolatile semiconductor memory device according to a third embodiment.

FIG. 19 shows a third embodiment and is a configuration diagram in a case where the flag register 20 as shown in FIG. 1 is not provided. In FIG. 19, the same reference numerals are assigned to the same components as those in FIG. 1.

According to the first and second embodiments, the state of the sub-block is stored on the flag cell which is arranged in the sub-block, and predetermined operations are controlled on the chip based on the information of the flag cell. However, it is necessary that the information of the flag cell be significantly reliable in order to control the above operations on the chip.

Thus, it can be considered to be more desirable to assign the control of the above operations to an external controller than to store the flag information on the chip. In such a case, the external controller issues a command or sets a parameter so as to be able to switch the operations in the first and second embodiments in consideration of the state of the other sub-block in the same block in selecting a certain sub-block and performing the writing operation thereon.

In such a case, it is possible to skip the processing in Steps ST11 to ST13 as shown in FIG. 11 and the processing in Steps ST21 to ST23 as shown in FIG. 12 in the first embodiment. In addition, it is possible to skip the processing in Steps ST11 to ST13 as shown in FIG. 16 and the processing in Steps ST21 to ST23 as shown in FIG. 17 in the second embodiment.

In addition, the exemplary embodiments are not limited to the exact above embodiments, and the components may be modified and realized in an implementation stage without departing from the gist. In addition, various embodiments can be formed by appropriate combination of the plurality of components disclosed in the respective embodiments. For example, some components may be omitted from all the components shown in the embodiments. Furthermore, the components in different embodiments may be appropriately combined.

A configuration of the memory cell array 11 is disclosed in U.S. patent application Ser. No. 12/407,403, filed on Mar. 19, 2009, entitled "three-dimensional stacked nonvolatile semiconductor memory". In addition, a configuration thereof is disclosed in U.S. patent application Ser. No. 12/406,524, filed on Mar. 18, 2009, entitled "three-dimensional stacked nonvolatile semiconductor memory", U.S. patent application Ser. No. 12/679,991, filed on Mar. 25, 2010, entitled "nonvolatile semiconductor memory device and manufacturing method thereof", and U.S. patent application Ser. No. 12/532,030, filed on Mar. 23, 2009, entitled "semiconductor memory and manufacturing method thereof". The entire contents of the above-mentioned Patent Applications are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell array which includes a plurality of memory strings divided into a plurality of sub-blocks, each memory string including a plurality of memory cells connected to word lines and each sub-block being erasable independently with respect to the other sub-blocks;
a control unit configured to change a verification voltage to be applied to a selected word line included in a selected sub-block when data is written, depending on whether or not data is written in a non-selected sub-block; and
flag cells which are respectively provided in the plurality of sub-blocks and store flag data indicating whether or not data is written in the sub-blocks,
wherein when the flag data which is stored in the flag cell in the non-selected sub-block indicates writing, the control unit sets the verification voltage to be higher than when the flag data does not indicate writing in the non-selected sub-block.

2. The device according to claim 1,
wherein during writing, the control unit applies a first verification voltage to a first word line on a source side of the selected sub-block and applies a second verification voltage which is higher than the first verification voltage to a second word line farther toward a drain side than the first word line.

3. The device according to claim 2,
wherein when data is written in the non-selected sub-block, the control unit applies a third verification voltage which is higher than the second verification voltage to a third word line on a source side of the selected sub-block and applies a fourth verification voltage which is higher than the second verification voltage to a fourth word line farther toward a drain side than the third word line.

4. The device according to claim 1, wherein each of the word lines commonly connects a memory cell from each of the memory strings.

5. The device according to claim 1, wherein the memory cell array is a three-dimensional memory cell array.

6. A method of writing data in a nonvolatile semiconductor memory device comprising a memory cell array which includes a plurality of memory strings divided into a plurality of sub-blocks, each memory string including a plurality of memory cells connected to word lines and each sub-block being erasable independently with respect to the other sub-blocks and including flag data indicating whether or not data is written therein, said method comprising:
selecting a sub-block for writing;
determining whether or not data is written in a non-selected sub-block by reading the flag data corresponding to the non-selected sub-block; and
changing a verification voltage to be applied to a selected word line included in the selected sub-block based on said determining,
wherein when the flag data corresponding to the non-selected sub-block indicates writing, setting the verification voltage to be higher than when the flag data does not indicate writing in the non-selected sub-block.

7. The method according to claim 6,
wherein during writing, applying a first verification voltage to a first word line on a source side of the selected sub-block and applying a second verification voltage which is higher than the first verification voltage to a second word line farther toward a drain side than the first word line.

8. The method according to claim 7,
wherein when data is written in the non-selected sub-block, applying a third verification voltage which is higher than the second verification voltage to a third word line on a source side of the selected sub-block and applying a fourth verification voltage which is higher than the second verification voltage to a fourth word line farther toward a drain side than the third word line.

9. The method according to claim 6, wherein each of the word lines commonly connects a memory cell from each of the memory strings.

10. The method according to claim 6, wherein the memory cell array is a three-dimensional memory cell array.

11. The method according to claim 6, further comprising:
writing data to the selected sub-block; and
verifying the data written to the selected sub-block by supplying the verification voltage to the selected word line.

\* \* \* \* \*